(12) United States Patent
Ishihara

(10) Patent No.: US 6,653,554 B2
(45) Date of Patent: Nov. 25, 2003

(54) THIN FILM POLYCRYSTALLINE SOLAR CELLS AND METHODS OF FORMING SAME

(75) Inventor: Shunichi Ishihara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/097,265

(22) Filed: Mar. 15, 2002

(65) Prior Publication Data

US 2002/0189664 A1 Dec. 19, 2002

(30) Foreign Application Priority Data

Mar. 15, 2001 (JP) ........................................ 2001-073777
Mar. 13, 2002 (JP) ........................................ 2002-069231

(51) Int. Cl.$^7$ ................. H01L 31/0368; H01L 31/0376
(52) U.S. Cl. ........................ 136/258; 136/249; 136/255; 136/261; 257/64; 257/66; 257/53; 257/461; 257/458; 438/96; 438/97
(58) Field of Search ................................ 136/258, 249, 136/255, 261; 257/64, 66, 53, 461, 458; 438/97, 96

(56) References Cited

U.S. PATENT DOCUMENTS 5,246,886 A * 9/1993 Sakai et al. ................. 438/488
5,667,597 A * 9/1997 Ishihara ...................... 136/258
5,956,602 A * 9/1999 Ishihara ...................... 438/491
6,534,334 B2 * 3/2003 Sasaki ........................... 438/57

FOREIGN PATENT DOCUMENTS

JP        2-72676 A    *   3/1990
JP        8-88189 A    *   4/1996
JP    2000-332268 A    * 11/2000

* cited by examiner

*Primary Examiner*—Alan Diamond
(74) *Attorney, Agent, or Firm*—Fitzpatrick, Cella, Harper & Scinto

(57) ABSTRACT

A thin film polycrystalline solar cell which includes a substrate, a first semiconductor layer provided on the substrate and including Si highly doped with a conductivity-type controlling impurity, a second semiconductor layer provided on the first semiconductor layer and including polycrystalline Si slightly doped with a conductivity-type controlling impurity of the same conductivity-type as that of the first semiconductor layer, and a third semiconductor layer provided on the second semiconductor layer and highly doped with a conductivity-type controlling impurity of a conductivity-type opposite to that of the impurities for the doping of the first and the second semiconductor layers. Crystal grains grown from crystal nuclei generated in the first semiconductor layer are continuously grown to form the first and second semiconductor layers, are horizontally grown to contact neighboring crystal grains, and are perpendicularly grown to form an interface with the third semiconductor layer.

13 Claims, 13 Drawing Sheets

THIN FILM POLYCRYSTALLINE SOLAR CELLS AND METHODS OF FORMING SAME

BACKGROUND OF THE INVENTION

1. Field of the Invention

The present invention relates to thin film polycrystalline solar cells and methods of forming them.

2. Related Background Art

The thin film polycrystalline Si solar cells have polycrystalline Si films formed by film formation steps such as CVD, epitaxial growth, etc., can be produced at a lower production cost than bulk crystal solar cells produced by forming a semiconductor junction in a wafer, are expected to achieve a higher photoelectric conversion efficiency than a-Si solar cells, and are promising candidates as next generation solar cells. Typical structures of the conventional thin film polycrystalline Si solar cells include those of the pn junction as shown in FIG. 15 or of the pin junction as shown in FIG. 16.

In FIG. 15, numeral 81 designates a substrate also serving as a support, and 82 an electroconductive metal film that also acts as a light reflecting layer. Numeral 83 denotes a polycrystalline Si thin film semiconductor layer doped in a high concentration with an impurity of a conductivity type, which is laid in order to establish good electrical contact between the metal layer 82 and a semiconductor layer 84. Numeral 84 represents a polycrystalline Si thin film semiconductor layer, which is normally doped with a slight amount of an impurity of the same conductivity type as that of the layer 83. Inside this layer 84 a potential distribution is made on the basis of contact with a layer 85, and thus the layer 84 acts as a photocharge generating layer. Numeral 85 indicates a thin film semiconductor layer doped in a high concentration with an impurity of the opposite conductivity type to that of the layers 83 and 84. Numeral 87 denotes an antireflection layer for preventing reflection of light, which is provided for taking in light efficiently. Numeral 86 stands for collecting electrodes for extraction of electric current.

When the solar cells are constructed using films of polycrystalline Si of small crystal grain sizes, the pin structure as shown in FIG. 16 is employed in order to flow the electric current by drift. Numeral 91 designates a substrate also serving as a support, and 92 an electroconductive metal film also acting as a light reflecting layer. Numeral 93 denotes a polycrystalline Si thin film semiconductor layer doped with an impurity of a conductivity type. Numeral 94 represents an intrinsic, polycrystalline Si thin film semiconductor layer.

Numeral 95 represents a thin film semiconductor layer doped with an impurity of the opposite conductivity type to that of the layer 93. An electric field is established in the intrinsic semiconductor layer 94 interposed between the layer 93 and the layer 95, and the charge generated in the layer 94 flows along the electric field. Numeral 97 indicates an antireflection layer for preventing reflection of light, which is provided for taking in light efficiently. Numeral 96 stands for collecting electrodes for extraction of electric current.

The solar cells of such structures can be produced without necessity for slicing and polishing steps, different from the bulk crystal Si solar cells, and thus the production cost can be lower. Since they can also be produced on the substrate of glass, metal, or the like, it is also feasible to perform continuous production. For this reason, they can also be used in the stack structure with the a-Si solar cells and, therefore, the polycrystalline Si thin film semiconductor layers are promising materials as a long-wavelength light absorbing and photocharge generating layer. The reason is that the a-SiGe film also used similarly as a long-wavelength light absorbing and photocharge generating layer has to be made of the high cost source material of $GeH_4$ gas.

The polycrystalline Si solar cells of the structure of FIG. 15 or FIG. 16 were actually produced to evaluate their characteristics and it was shown that short-circuit currents and fill factors were greatly different among samples. None of the samples demonstrated good short-circuit current and fill factor characteristics. To yield solar cells with good characteristics about the both short-circuit current and fill factor was thus a significant subject in the research on the thin film polycrystalline Si solar cells.

SUMMARY OF THE INVENTION

An object of the present invention is to provide thin film polycrystalline Si solar cells with good characteristics about both the short-circuit current and fill factor.

According to a first aspect of the present invention, there is provided a thin film polycrystalline solar cell comprising a substrate; a first semiconductor layer provided on the substrate and comprised of Si highly doped with a conductivity-type controlling impurity; a second semiconductor layer provided on the first semiconductor layer and comprised of polycrystalline Si slightly doped with a conductivity-type controlling impurity of the same conductivity type as that of the first semiconductor layer; and a third semiconductor layer provided on the second semiconductor layer and highly doped with a conductivity-type controlling impurity of a conductivity type opposite to that of the impurities for the doping of the first and the second semiconductor layers, wherein crystal grains grown from crystal nuclei generated in the first semiconductor layer are continuously grown to form the first and the second semiconductor layers, are also horizontally grown to contact neighboring crystal grains, and are perpendicularly grown to form an interface with the third semiconductor layer.

According to a second aspect of the present invention, there is provided a thin film polycrystalline solar cell comprising a substrate; a first semiconductor layer provided on the substrate and comprised of Si doped with a conductivity-type controlling impurity; a second semiconductor layer provided on the first semiconductor layer and comprised of Si of an intrinsic conductivity type; and a third semiconductor layer provided on the second semiconductor layer and doped with a conductivity-type controlling impurity of a conductivity type opposite to that of the impurity for the doping of the first semiconductor layer, wherein crystal grains grown from crystal nuclei generated in the first semiconductor layer are continuously grown to form the first and the second semiconductor layers, are also horizontally grown to contact neighboring crystal grains, and are perpendicularly grown to form an interface with the third semiconductor layer.

The first aspect as described above includes a solar cell having the structure of $n^+/n^-/p^+$ or $p^+/p^-/n^+$, and the second aspect includes a solar cell having the structure of n/i/p or p/i/n.

A method of forming a thin film polycrystalline solar cell according to the present invention is a method of forming a thin film polycrystalline solar cell by stacking on a substrate a first semiconductor layer of a thin film comprised of Si highly doped with a conductivity-type controlling impurity, stacking thereon a second semiconductor layer of a thin film comprised of polycrystalline Si slightly doped with a conductivity-type controlling impurity of the same conductivity type as that of the first semiconductor layer, and further stacking thereon a third semiconductor layer of a thin film highly doped with a conductivity-type controlling impurity of a conductivity type opposite to that of the impurities for the doping of the first and the second semiconductor layers, thereby forming a solar cell with a semiconductor junction structure of $n^+/n^-/p^+$ or $p^+/p^-/n^+$, the method comprising: repeatedly carrying out film deposition and plasma processing to form the first semiconductor layer; then growing crystal grains from crystal nuclei generated in the first semiconductor layer in a direction perpendicular to the substrate and also growing the crystal grains in a horizontal direction until the crystal grains contact neighboring crystal grains, and also effecting continuous growth of the crystal grains in the second semiconductor layer up to an interface with the third semiconductor layer, thereby forming the second semiconductor layer.

In the solar cells and the method described above, preferably, the crystal nucleus density of the crystals perpendicularly grown in the first semiconductor layer is not more than $1 \times 10^{10}$ cm$^{-3}$.

In the solar cells and the method described above, preferably, the shape of a region in which each crystal grown from a crystal nucleus is horizontally grown to contact neighboring crystals, in the first semiconductor layer, is a cone (or circular cone) or pyramid having an apex angle of not less than 60° in a cross section parallel to the direction of the growth.

The term "pyramid" as herein employed is intended to embrace tri- or more angular pyramids including triangular pyramid, quadratic pyramid, pentagonal pyramid, and so on.

As to the description of the location of beginning of crystal growth, the expression "crystal growth in a layer (e.g., the first layer)" as herein employed is intended to mean crystal growth beginning at a location inside the layer and to exclude crystal growth beginning at an interface between the layer and another layer or substrate adjacent to the layer.

In the solar cells and the method described above, preferably, the crystals grown in the second semiconductor layer up to the interface with the third semiconductor layer have an average grain diameter of not less than 100 nm in a direction parallel to the substrate.

In the solar cells and the method described above, preferably, the interface formed between the crystals grown in the second semiconductor layer and the third semiconductor layer has an unevenness of not less than 20 nm.

According to the present invention, the solar cells are those wherein crystal nuclei generate within the first semiconductor layer, the crystal grains are grown in (or as) the second semiconductor layer up to the interface with the third semiconductor layer, and the crystal layer comprised of the crystal grains is used as a generation layer and transport layer of photocharge, and in these solar cells the charge generated in the crystal grains is transported in the direction perpendicular to the substrate without being affected by grain boundaries and a high-resistance layer of nondoped amorphous Si or the like, which can successfully enhance the fill factor characteristic. In addition, the average grain diameter of the crystal grains is not less than 100 nm and the shape of the crystals at the interface is provided with an unevenness of not less than 20 nm, which can successfully attain a large short-circuit current characteristic.

DESCRIPTION OF THE PREFERRED EMBODIMENTS

Figure 1:
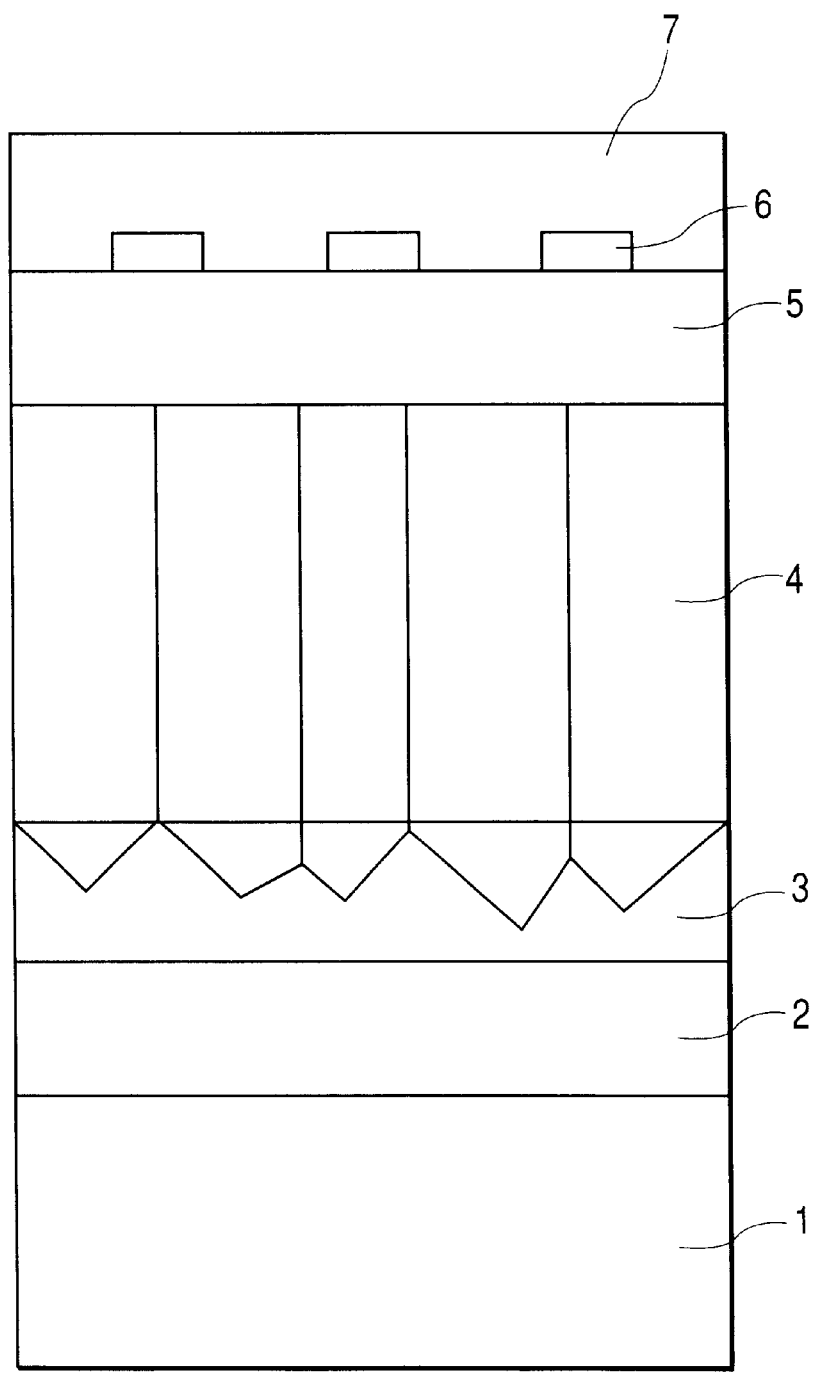
FIG. 1 is a schematic representation showing a configuration example of a solar cell according to the present invention.

FIG. 1 shows an embodiment of the present invention. Numeral 1 designates a substrate also serving as a support, and 2 an electroconductive metal film that also acts as a light reflecting layer. Numeral 3 represents a Si thin film semiconductor layer (first semiconductor layer) doped in a high concentration with an impurity of a first conductivity type. This layer 3 is provided in order to achieve good electrical contact with a semiconductor layer 4. Numeral 4 indicates a Si thin film semiconductor layer (second semiconductor layer) doped with a slight amount of an impurity of the same conductivity type as that of the first semiconductor layer 3, and in this layer 4 a potential distribution is established on the basis of contact with a layer 5. Thus, the layer 4 acts as a photocharge generating layer. Numeral 5 denotes a thin film semiconductor layer (third semiconductor layer) doped in a high concentration with an impurity of the opposite conductivity type to that of the layers 3 and 4. Numeral 7 indicates an antireflection layer for preventing reflection of light, which is deposited so as to take in light efficiently.

An amorphous Si film doped in a high concentration with the impurity of the first conductivity type is formed in the vicinity of the interface between the first semiconductor layer 3 and the metal layer (reflecting layer) 2. Crystal nuclei are formed in the amorphous Si film, crystals are grown from the crystal nuclei in the direction perpendicular to the substrate and also grown in the horizontal (or lateral) direction to contact neighboring crystals, and thereafter the crystals are also continuously grown in the second semiconductor layer 4 up to the interface with the third semiconductor layer 5.

The crystal nucleus density of the crystals perpendicularly grown in the first semiconductor layer 3 is not more than $1 \times 10^{10}$ cm$^{-3}$.

In the first semiconductor layer 3, the shape of a region in which each crystal grown from a crystal nucleus is grown to contact laterally neighboring crystals, is a cone or pyramid having an apex angle of not less than 60° in a cross section parallel to the direction of the perpendicular growth.

The crystals are also continuously grown in the second semiconductor layer 4 up to the interface with the third semiconductor layer 5, and the average grain diameter of the crystals in the direction parallel to the substrate is not less than 100 nm.

The crystals are also continuously grown in the second semiconductor layer 4 up to the interface with the third semiconductor layer 5 to form a shape at the interface with an unevenness of not less than 20 nm.

Numeral 6 stands for collecting electrodes for extraction of electric current. The substrate 1 is normally made of metal, glass, synthetic resin or the like, and functions as a support for supporting the constitutive substances of the solar cell. The metal layer 2 covers the surface of the substrate and functions as an electrode. The metal layer is formed by ordinary evaporation, sputtering, printing, coating, or the like. In the case where the substrate is made of an electroconductive material such as metal or the like, the substrate may also be used as an electrode as it is. When it is desirable to decrease the resistance of the electrode or to reflect light on the electrode to enhance absorption of light in the polycrystalline Si semiconductor layer, a metal such as Ag, Al, Cu, or the like with low resistivity and high reflectance may be placed in a simple substance or alloy form and in a single-layer or stack structure on the electrode, so as to form the electrode and a reflecting layer.

By providing the surface of the substrate 1 with unevenness within the range of about 0.1 to 100 μm or by using a film with an uneven surface shape like an Ag film formed at the temperature of not less than 300° C., as the metal layer 2, diffused reflection is increased on the surface of the metal layer and reflected light increases absorption of light in the second semiconductor layer 4, thereby increasing the amount of electric current generated. If the antireflection layer 7 also has an uneven surface shape, the light reflected on the metal layer 2 will be also diffusely reflected on this layer 7, so as to increase the rate of light again traveling in the second semiconductor layer 4. As a consequence, the light is confined in the solar cell and travels back and forth in the second semiconductor layer 4. This results in increasing the amount of absorbed light in the second semiconductor layer 4. This effect is more prominent in wavelength regions or substances with relatively small absorption coefficients of light. It is advantageous in absorption of long wavelength light in crystalline Si. As a result, a satisfactory current can be generated even in a thin crystalline Si film of small thickness.

When the surface of the substrate 1 is provided with unevenness or when the metal film 2 is the film with the uneven surface shape, the structure of the solar cell made thereon also reflects the uneven shape and brings about a shunt readily. In order to prevent influence of the shunt from spreading to the entire cell, therefore, there are also cases where a layer of a transparent material with high conductivity in the vertical direction like ZnO or $In_2O_3$ is formed on the metal layer 2. Since ZnO and $In_2O_3$ have the columnar crystal structure, they have conductivities low in the lateral direction and high in the vertical direction but lower than those of metals and thus they themselves have moderate resistance.

The Si semiconductor thin films 3, 4, 5 are produced by their respective production methods properly selected from various methods, depending upon the substrate used; for example, (1) the CVD process of decomposing source gas (gas such as $SiH_4$, $SiCl_2H_2$, $Si_2H_6$, $SiF_2H_2$, or the like) on the heated substrate to obtain a Si film; (2) the plasma discharge process of flowing the source gas such as $SiH_4$, $Si_2H_6$, $SiF_4$, $Si_2F_6$, $SiCl_2H_2$, $SiF_2H_2$, or the like together with a large amount of $H_2$ in a chamber with the substrate loaded therein and inducing glow discharge under the applied condition of power of RF, LF, VHF, microwave, or the like to deposit the film; (3) a deposition process (HRCVD process) of guiding $SiF_n$ (n=1 to 3) radicals and H radicals generated in their respective, separate spaces contiguous to a film formation space, into the film formation space to cause collision and reaction between the $SiF_n$ radicals and H radicals in the gas phase, thereby generating film-forming radicals $SiF_lH_m$ (l+m≦3) and forming the Si film on the substrate placed in the film formation space; and other appropriate processes. Particularly, the HRCVD process (3) is excellently applicable to production of the polycrystalline film with the crystal grain diameter of not less than 1000 Å at temperatures of not more than 500° C.

Methods of introducing the impurity for control of the conductivity type include methods of introducing the impurity into the Si layer after deposition and methods of mixing the impurity in the source gas during film formation and introducing the impurity simultaneously with deposition, such as ion implantation, radical implantation, the diffusion process, and so on, from which an appropriate method can be applied. The Si thin film semiconductor layer 3 (first semiconductor layer) doped in the high concentration with the impurity of the first conductivity type is provided in order to maintain a state of good electrical contact between the second semiconductor layer 4 and the metal layer 2. As a result, there is no electrical barrier formed between the second semiconductor layer 4 and the first semiconductor layer 3 and between the first semiconductor layer 3 and the metal layer 2, thus yielding ohmic contact.

The second semiconductor layer 4 is a layer absorbing light to generate a charge, thus being a power generating layer. The second semiconductor layer 4 needs to have the thickness enough to absorb incident light. However, if the thickness is too large the charge migration distance will increase, so as to result in decrease in the electric current taken out to the outside. From the aspect of cost, the thicker layer is disadvantageous in increase of production time and increase in amounts of materials used.

The second semiconductor layer 4, in combination with the metal layer 2, can absorb the incident light efficiently, so that the film thickness thereof can be decreased. The film thickness is preferably not less than 1 μm nor more than 10 μm. The second semiconductor layer 4 is doped with a slight amount of the impurity for control of the conductivity type in order to form a good pn junction with the thin film semiconductor layer 5 doped in the high concentration with the impurity of the opposite conductivity type to that of the layer 3. Namely, the second semiconductor layer 4 needs to be of the conductivity type opposite to that of the third semiconductor layer 5 and identical to that of the first semiconductor layer 3 so as to yield ohmic contact without forming a junction.

The second semiconductor layer 4 is comprised of polycrystals comprised of Si which are grown from crystal nuclei formed in the first semiconductor layer 3 and each of which is a continuous crystal grain in the perpendicular direction. The amount of the impurity in the second semiconductor layer 4 should not be too large, in order to allow a depletion layer to spread across the entire second semiconductor layer 4 when the pn junction is formed. However, if the impurity amount is too small, the series resistance will be large, so as to result in loss on the occasion of extraction of current to the outside. Therefore, the mixing amount of the impurity is generally controlled so that the resistivity of the second semiconductor layer 4 falls within the range of 0.1 Ω·cm to 100 Ω·cm.

The third semiconductor layer 5 is a layer for forming the pn junction with the second semiconductor layer 4. The thickness of the third semiconductor layer 5 is desirably thin enough for the second semiconductor layer 4 to absorb sufficient light and generate a charge in the structure forming the pn junction with the second semiconductor layer 4. The thickness is desirably not more than 2000 Å. In order to make the pn junction of large open-circuit voltage with the second semiconductor layer 4, it is necessary to introduce a large amount of the impurity for valence electron control. The significant point is that free electrons or holes are efficiently made by the introduced impurity and the Fermi level is sufficiently moved toward the conduction band or toward the valence band. In general, a large amount of the impurity is introduced so that the resistivity becomes not more than 1 Ω·cm.

Materials suitable for the third semiconductor layer 5 are normally amorphous silicon, amorphous silicon carbide, polycrystalline silicon, and polycrystalline silicon carbide.

The collecting electrodes 6 are used for flowing the charge collected in the third semiconductor layer 5, to an external circuit. The collecting electrodes are made by forming a grid pattern or a comb-shaped pattern of metal such as Ag, Al, Cu, or the like with high conductivity by evaporation, paste coating, or the like, or by bonding wires of metal onto the third semiconductor layer 5.

The collecting electrodes desirably have the width as narrow and the spacing as wide as possible in order to increase the amount of light incident into the second semiconductor layer 4. However, if the width is too narrow and the spacing is too wide on the other hand, the series resistance will increase to hinder the generated charge from being extracted efficiently to the external circuit. Accordingly, the width is normally determined in the range of 0.02 to 1 mm and the spacing in the range of 1 mm to 5 cm. The actual width and spacing of the collecting electrodes are properly determined depending upon values of surface resistance of the third semiconductor layer 5 and antireflection layer 7.

The antireflection layer 7 is provided on the third semiconductor layer 5 in order to guide the light entering the solar cell efficiently into the second semiconductor layer 4. A material of the antireflection layer 7 is normally either of metal oxides, e.g., $In_2O_3$, $SnO_2$, $TiO_2$, ZnO, ZrO, and so on.

The thickness of the antireflection layer is determined so as to minimize reflection in consideration of the refractive index of the material.

In the case where the antireflection layer is made of a material with low resistivity and the surface resistance thereof is lower than that of the third semiconductor layer 5, the solar cell may be constructed in structure wherein the collecting electrodes 6 are placed on the antireflection layer 7.

Figure 2:
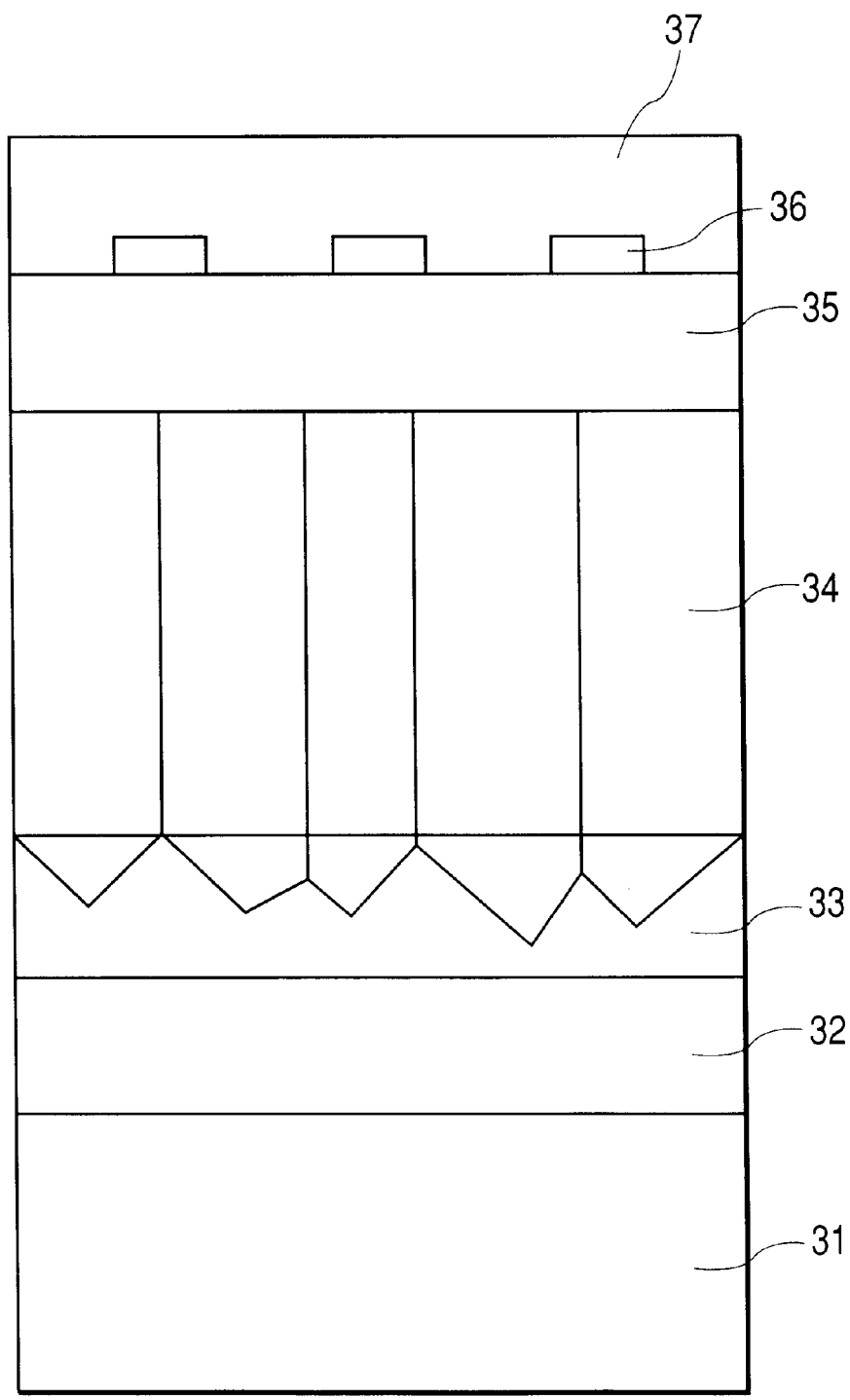
FIG. 2 is a schematic representation showing another configuration example of a solar cell according to the present invention.

FIG. 2 shows another configuration example of a solar cell of the present invention. The solar cell of FIG. 2 is different from that of FIG. 1 in that a pin junction is formed of the first semiconductor layer 33, the second semiconductor layer 34, and the third semiconductor layer 35.

The Fermi level of the second semiconductor layer 34 is located near the center of the bandgap and thus the second semiconductor layer 34 exhibits the intrinsic conductivity. The second semiconductor layer 34 contains no impurity for control of conductivity type at all, or contains a slight amount of a compensation impurity for control of the conductivity type opposite to that of an impurity included therein without intension during fabrication of the layer in order to locate the Fermi level near the center of the bandgap.

This configuration is generally used in the case where the diffusion length of the minority carrier is short in the second semiconductor layer and the diffusion current becomes insufficient if the second semiconductor layer has the thickness enough to absorb light effectively. Namely, it is a technique of securing the electric current by drift based on an internal electric field.

EXAMPLES

The present invention will be described below in more detail with examples thereof.

Example 1

The solar cell having the structure of FIG. 1 was produced according to the procedure below.

A stainless steel substrate having the thickness of 1 mm and the area of 5 cm×5 cm was cleaned with acetone and isopropyl alcohol, dried well, and thereafter mounted in an electron beam evaporation system. The interior of the system was controlled to the vacuum degree of $1.33 \times 10^{-4}$ Pa or less and a film of Ag was formed in the thickness of about 500 Å to obtain the reflecting layer 2 on the substrate 1. The substrate 1 was taken out and set on a substrate holder 57 in a plasma enhanced film formation system of FIG. 3. At this time the substrate temperature was kept at room temperature.

Figure 3:
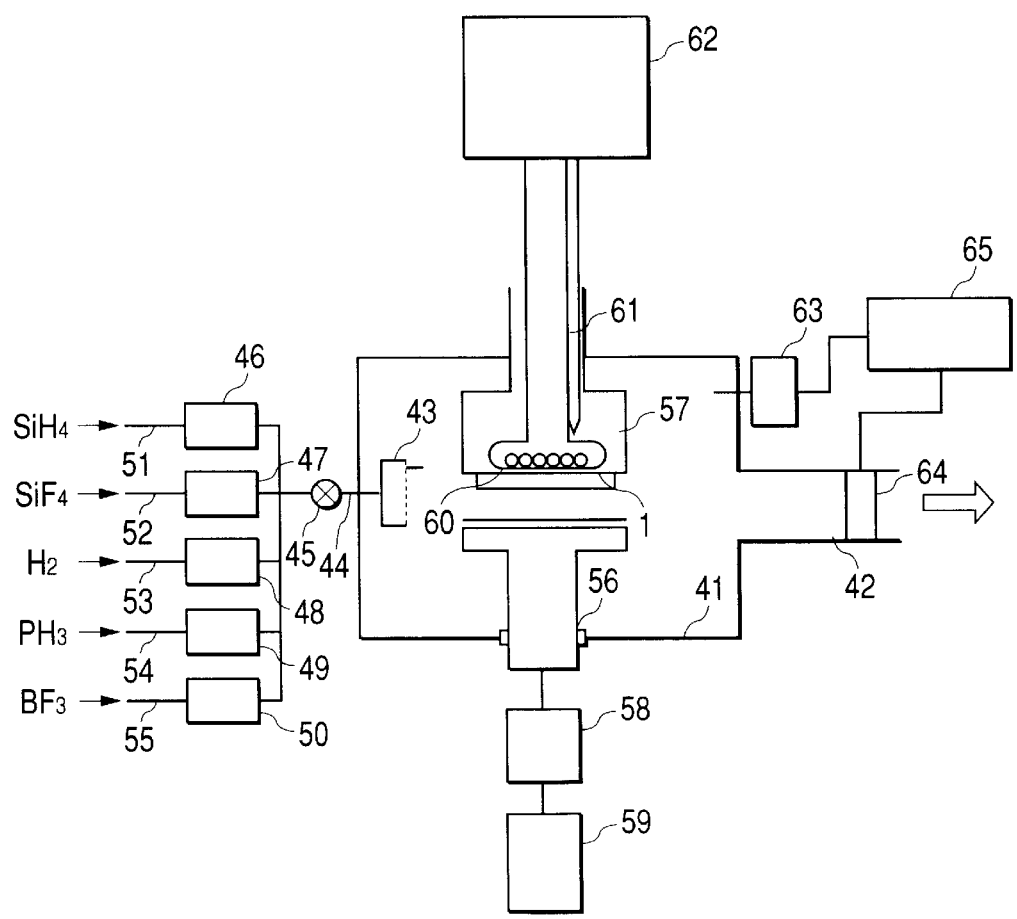
FIG. 3 is a schematic representation of a plasma CVD film formation apparatus for forming polycrystal silicon films, used in Example 1 of the present invention.

The plasma enhanced film formation system used in the present example will be described below. In FIG. 3, numeral 41 designates a vacuum chamber, and 42 an exhaust pipe which is connected to a turbo-molecular pump and a rotary pump not shown and which evacuates the interior of the vacuum chamber. Numeral 43 denotes a gas outlet for source gas, from which the source gas is supplied through a source gas supply pipe 44. A valve 45 actuated by compressed air is mounted in the middle of the source gas supply pipe, in order to prevent the source gas from being introduced into the chamber in the event of emergency, e.g., upon a stop of the pump or the like.

Mass flow controllers 46 to 50 for respective gases are connected to the source gas supply pipe 44 to control the supply of each gas at a required flow rate into the chamber. The mass flow controllers used in the present example are those obtained by applying a piezoelectric material to flow control valves and having the response speed of about 0.2 sec. Numeral 46 denotes the mass flow controller for $SiH_4$ gas, to which the $SiH_4$ gas is supplied through a supply pipe 51 from a gas cylinder not shown. Likewise, numerals 47, 48, 49, and 50 represent the mass flow controllers for $SiF_4$ gas, for $H_2$ gas, for $PH_3$ gas diluted to 0.5% with $H_2$ gas, and for $BF_3$ gas diluted to 0.5% with $H_2$, respectively. Numerals 52, 53, 54, and 55 indicate gas supply pipes to the respective gas mass flow controllers, which are connected to their respective gas cylinders not shown.

Numeral 56 designates an electrode for inducing a plasma, which is connected through a matching box 58 to a high frequency power supply 59 of 105 MHz. Numeral 57 denotes a substrate holder, which is grounded. When the high frequency electric power from the high frequency power supply 59 is applied under flow of the source gas, plasma discharge takes place between the electrode 56 and the substrate holder 57. The substrate 1 is mounted on the surface of the substrate holder 57, and a heater 60 for heating the substrate, and a thermocouple 61 are embedded inside the substrate holder 57. Lead wires from each of the heater 60 and the thermocouple 61 are connected to a temperature controller 62, and the substrate holder 57 is maintained at a set temperature thereby. Numeral 63 represents a pressure gage for measuring the pressure inside the chamber, and 64 a pressure control valve for controlling the pressure inside the chamber. Numeral 65 stands for a control system for controlling the pressure, which maintains the pressure inside the chamber at a constant set value even with variation in the flow rate of the source gas.

After the substrate 1 was mounted on the substrate holder 57, the interior of the chamber was evacuated to $1 \times 10^{-4}$ Pa or less.

Thereafter, the temperature controller 62 was set at the substrate temperature of 400° C. and then the substrate holder 57 was heated by the heater 60.

After arrival at the set temperature, the $Si_4$ gas was allowed to flow at 0.1 sccm by the mass flow controller for $SiH_4$ gas, the $SiF_4$ gas at 40 sccm by the mass flow controller for $SiF_4$ gas, the $H_2$ gas at 70 sccm by the mass flow controller for $H_2$ gas, and the $PH_3$ gas diluted to 0.5% with $H_2$ gas at 5 sccm (for the dilute gas) by the mass flow controller for $PH_3$ gas, and the pressure in the chamber was set at 50 Pa by the pressure controller 65. In this state, the high frequency power of 105 MHz and 20 W was applied from the high frequency power supply 59 to the electrode 56 to induce the plasma discharge between the electrode 56 and the substrate holder 57. The flow of each of the $SiH_4$ gas, the $SiF_4$ gas, and the $PH_3$ gas diluted to 0.5% with $H_2$ gas was repeatedly switched on and off every ten seconds to be introduced into the chamber, by controlling signals to each mass flow controller. On the other hand, the $H_2$ gas was always introduced at 70 sccm into the chamber. As a consequence, film deposition and $H_2$ plasma processing steps were carried out at intervals of ten seconds.

The film deposition and $H_2$ plasma processing steps were conducted for ten minutes to deposit a thin film Si semiconductor layer (first semiconductor layer) 3 doped in a high concentration with P, in the thickness of about 400 Å on the substrate. After that, the application of the high frequency power was halted.

Then, the flow rate of the $PH_3$ gas diluted to 0.5% with $H_2$ gas was changed to 0.2 sccm, the flow rates of the other gases were maintained, the substrate was also kept at 400° C., the pressure inside the chamber was set at 50 Pa by the pressure controller, and the system was kept standing in this state for thirty minutes.

Thereafter, the high frequency power of 105 MHz and 20 W was applied to the electrode 56 in this state to induce the plasma discharge between the electrode 56 and the substrate holder 57. All the gases were continuously flowed.

This state was maintained for six hours to form a Si thin film semiconductor layer (second semiconductor layer) 4 doped with a slight amount of P, in the thickness of about 3 μm on the thin film Si semiconductor layer (first semiconductor layer) 3 doped in the high concentration with P.

Then, the substrate temperature was changed to 350° C. and the interior of the chamber was evacuated well. Thereafter, the $SiH_4$ gas was introduced at 0.5 sccm, the $H_2$ gas at 100 sccm, and the $BF_3$ gas diluted to 0.5% with $H_2$ at 2.0 sccm (for the dilute gas), and the pressure inside the chamber was set at 50 Pa. Then, the high frequency power of 105 MHz and 40 W was applied from the high frequency power supply.

The application of the high frequency power was continued for five minutes to result in forming a p-type thin film Si semiconductor layer (third semiconductor layer) 5 doped with B in the thickness of 150 Å on the polycrystalline silicon layer 4 on the substrate 1.

In this way, a pn junction was formed in the $n^+/n^-/p$ structure consisting of the reflecting metal layer 2 of Ag, the first semiconductor layer 3 doped in the high concentration with P, the second semiconductor layer 4 doped with the slight amount of P, and the third semiconductor layer 5 doped with the large amount of B on the stainless steel substrate 1.

Then, the substrate with the pn junction of polycrystalline silicon was taken out of the plasma film formation system and mounted in the electron beam evaporation system. A mask was set on the surface of the substrate and the comb-shaped collecting electrodes 6 having the width of 0.1 mm and the spacing of 5 mm were formed in three-layer structure of Cr/Ag/Cr.

Then, the foregoing substrate was mounted in a sputter system and sputtering was implemented with an $In_2O_3$ target in an oxygen atmosphere of 10 Pa to deposit the antireflection layer 7 in the thickness of 650 Å on the collecting electrodes 6.

The solar cell was made in the structure shown in FIG. 1, as described above. This sample will be referred to hereinafter as a solar cell A. The crystallinity of this solar cell was observed by X-ray diffraction and the polycrystalline film was strongly oriented to the (110) plane.

For comparison's sake, another solar cell was also produced according to the same production procedure and under the same conditions as the solar cell A, with the exception that the production procedure of the thin film Si semiconductor layer doped in the high concentration with P (first semiconductor layer) 3 was modified so as to introduce the $SiH_4$ gas, $SiF_4$ gas, and $PH_3$ gas diluted to 0.5% with $H_2$ gas continuously into the chamber.

This solar cell will be referred to hereinafter as a comparative solar cell B.

As another comparative example, a solar cell was also produced according to the same production procedure as the comparative solar cell B, except for the following points. After the production of the thin film Si semiconductor layer doped with in the high concentration with P (first semiconductor layer) 3, while the substrate was kept at 400° C., the $SiH_4$ gas was flowed at 0.1 sccm, the $SiF_4$ gas at 10 sccm, the $H_2$ gas at 100 sccm by the mass flow controller for $H_2$ gas, and the $PH_3$ gas diluted to 0.5% with $H_2$ gas at 0.2 sccm (for the dilute gas) by the mass flow controller for the $PH_3$ gas, and the pressure inside the chamber was set at 50 Pa by the pressure controller 65. In this state, the high frequency power of 105 MHz and 20 W was applied from the high frequency power supply 59 to the electrode 56 to continue film formation for five minutes.

Thereafter, the discharge was halted, the $SiF_4$ gas was changed to 40 sccm, and the $H_2$ gas to 70 sccm. After the pressure became stable at 50 Pa, the high frequency power of 105 MHz and 20 W was again applied to continue film formation for six hours. As a consequence, the Si thin film semiconductor layer doped with the slight amount of P (second semiconductor layer) 4 was formed in the thickness of about 3 $\mu$m on the first semiconductor layer 3.

Figure 5:
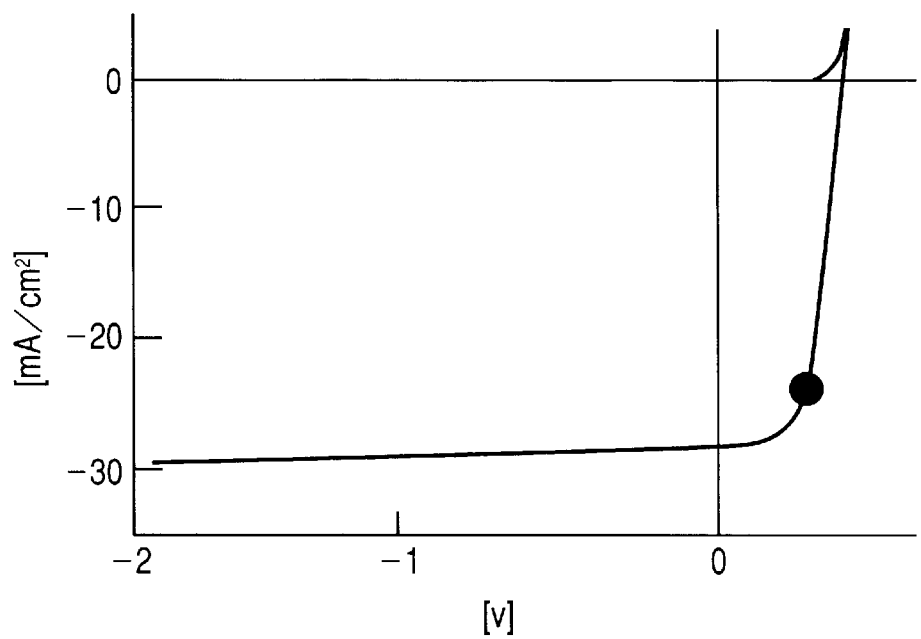
FIG. 5 is a graphical representation showing the result of Example 1, which shows the solar cell characteristics of the solar cell A.
Figure 6:
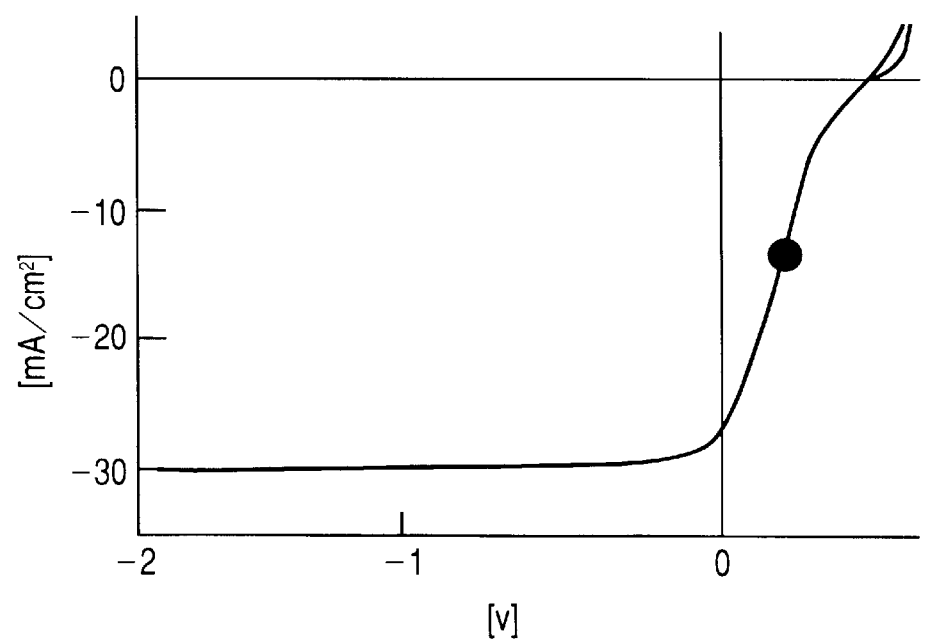
FIG. 6 is a graphical representation showing the result of Example 1, which shows the solar cell characteristics of the comparative solar cell B.
Figure 7:
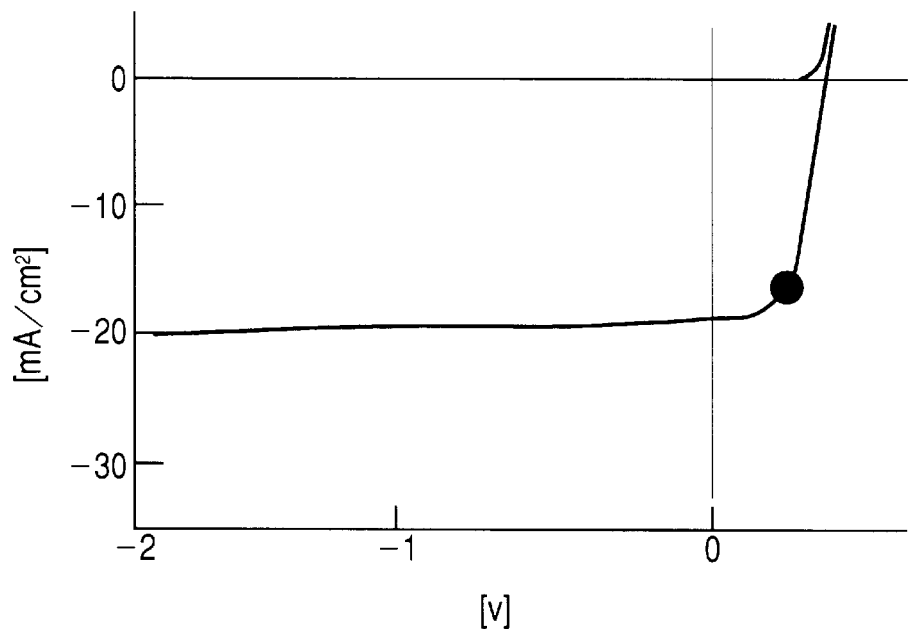
FIG. 7 is a graphical representation showing the result of Example 1, which shows the solar cell characteristics of the comparative solar cell C.

Thereafter, the p-type thin film Si semiconductor layer doped with B (third semiconductor layer) 5, comb-shaped collecting electrodes, and antireflection layer were made in much the same manner as in the solar cells A and B. The resultant cell will be referred to hereinafter as a comparative solar cell C. The characteristics of the solar cell A and the comparative solar cells B, C produced as described above were evaluated under irradiation with light of 100 mW/cm$^2$ from an AM1.5 simulator and the measurement results of I–V characteristics of the solar cells A, B, and C are presented in FIGS. 5, 6, and 7, respectively.

The solar cell A is excellent in both the short-circuit current and the fill factor. The comparative solar cell B shows the abnormal shape of the I–V curve and thus is inferior in the fill factor. For this reason, the short-circuit current is not greater than that of the solar cell A, but the solar cell B yields a large electric current under application of the backward voltage of –2 V thereto; i.e., a large electric current is extracted when the photocharge generated in the cell is forced to the external circuit. The abnormal shape of the I–V curve suggests such a structure that there exist high resistance components in series.

The comparative solar cell C has the good fill factor but has small values of both short-circuit current and the current under application of the backward voltage of –2 V to the cell.

Figure 9:
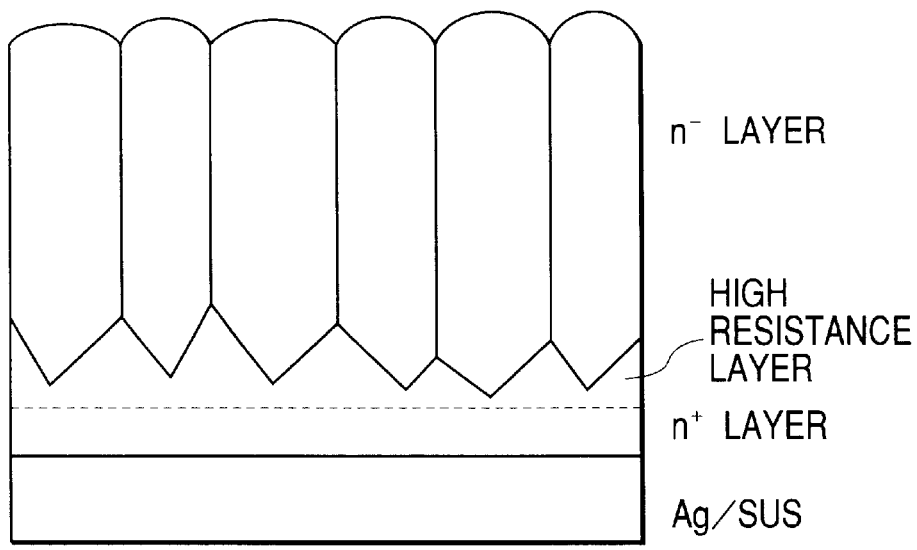
FIG. 9 is a view showing the result of Example 1, which shows a schematic representation of a crystal structure observed in a TEM image of the comparative solar cell B.
Figure 10:
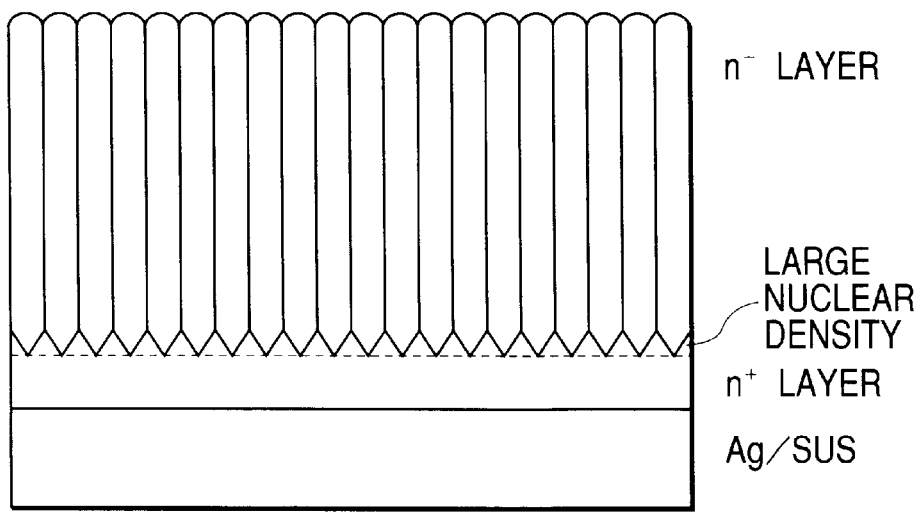
FIG. 10 is a view showing the result of Example 1, which shows a schematic representation of a crystal structure observed in a TEM image of the comparative solar cell C.

In order to check the crystal structures of these solar cells, sectional images thereof were taken with TEM (Transmission Electron Microscope) to observe the crystal structures of the solar cells. The results of the observation of the solar cells A, B, and C are presented in FIGS. 8, 9, and 10, respectively.

The border between the n$^+$ and n$^-$ layers was estimated from the results of analysis of P atoms by SIMS (Secondary Ion Mass Spectroscopy) and the deposition times and deposition rates of the respective layers.

Figure 8:
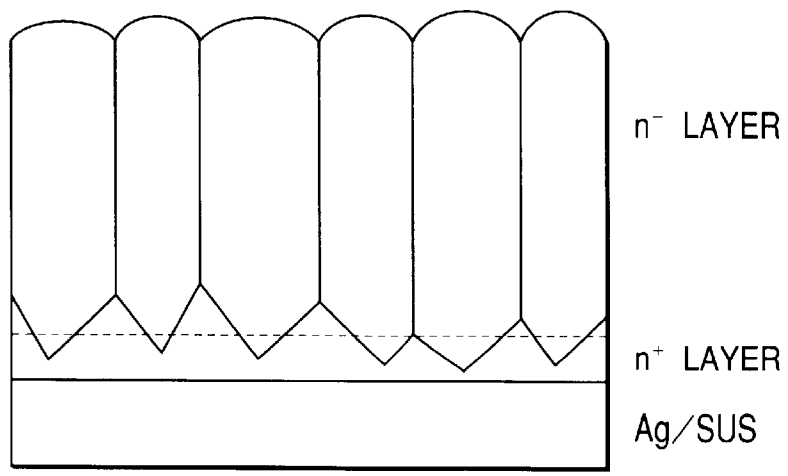
FIG. 8 is a view showing the result in Example 1, which shows a schematic representation of a crystal structure observed in a TEM image of the solar cell A.

As schematically shown in FIG. 8, the crystal grains generated in the n$^+$ layer (first semiconductor layer) are continuously grown through the inside of the n$^-$ layer (second semiconductor layer). This structure allows the charge generated in the second semiconductor layer under light irradiation to flow without hindrance in the second semiconductor layer and the first semiconductor layer and efficiently be taken out to the external circuit. In the sample of the solar cell A, the crystal nuclei are generated in the n$^+$ layer and the crystals are grown in deformed cone or pyramid structure with the solid angle of about 80° from the crystal nuclei. The crystal nucleus density of the perpendicularly grown crystals estimated from the TEM image was $3 \times 10^9$ cm$^{-3}$. The crystals are laterally grown to contact neighboring crystals. In the perpendicular direction, the crystals are grown first to contact the neighboring crystals and thereafter grown straight in the n$^-$ layer up to the interface with the p layer. The crystal grain diameters in the lateral direction in this sample were 100 to 300 nm. There was unevenness of about 50 nm at the distal ends of the crystals (i.e., at the upper ends on the drawing). This unevenness also produces a new effect of encouraging multiple reflection of light. The B-doped p-type thin film Si semiconductor layer (third semiconductor layer) 5 with the grain diameters of about 5 nm was formed over the unevenness.

In the sample of the comparative solar cell B, the crystals are grown in the same manner as in the solar cell A, with the exception that the crystal growth originates in the n$^-$ layer. There was no crystal generation observed in the n$^+$ layer. The crystal generation in the n$^+$ layer cannot be denied completely, but even if there were crystals generated in that layer the crystals did not undergo growth with deposition. There exists an amorphous n$^-$ layer with a high resistance between the n$^+$ layer and the crystal grains in the n$^-$ layer. (The existence of this layer was reconfirmed by an electron diffraction image of this part.) It is speculated that the existence of this high-resistance amorphous n$^-$ layer is the cause of degrading the fill factor among the solar cell characteristics.

In the sample of the comparative solar cell C, there was no crystal generation observed in the n$^+$ layer as in the case of the sample of the solar cell B.

A number of crystals were perpendicularly grown in the n$^-$ layer from the interface between the n$^+$ layer and the n$^-$ layer. The crystal nucleus density of the perpendicularly grown crystals estimated from the TEM image was $2 \times 10^{11}$ cm$^{-3}$. The crystal grain diameters in the lateral direction were about 25 nm.

The unevenness was about 10 nm at the distal ends of the crystals.

After the samples of the solar cells A, B, C were continuously exposed to light of AM1.5 and 100 mW/cm$^2$ for a long period (about 100 hours), no change of characteristics was observed in either of the solar cells.

Example 2

The solar cell of the structure of FIG. 2 was produced according to the procedure described below.

A stainless steel substrate having the thickness of 1 mm and the area of 5 cm×5 cm was cleaned with acetone and isopropyl alcohol, dried well, and thereafter mounted in the electron beam evaporation system. The vacuum degree inside the system was controlled to $1.33 \times 10^{-4}$ Pa or less and thereafter a film of Ag was formed in the thickness of about 500 Å to obtain the reflecting layer 32 on the substrate 31.

Figure 4:
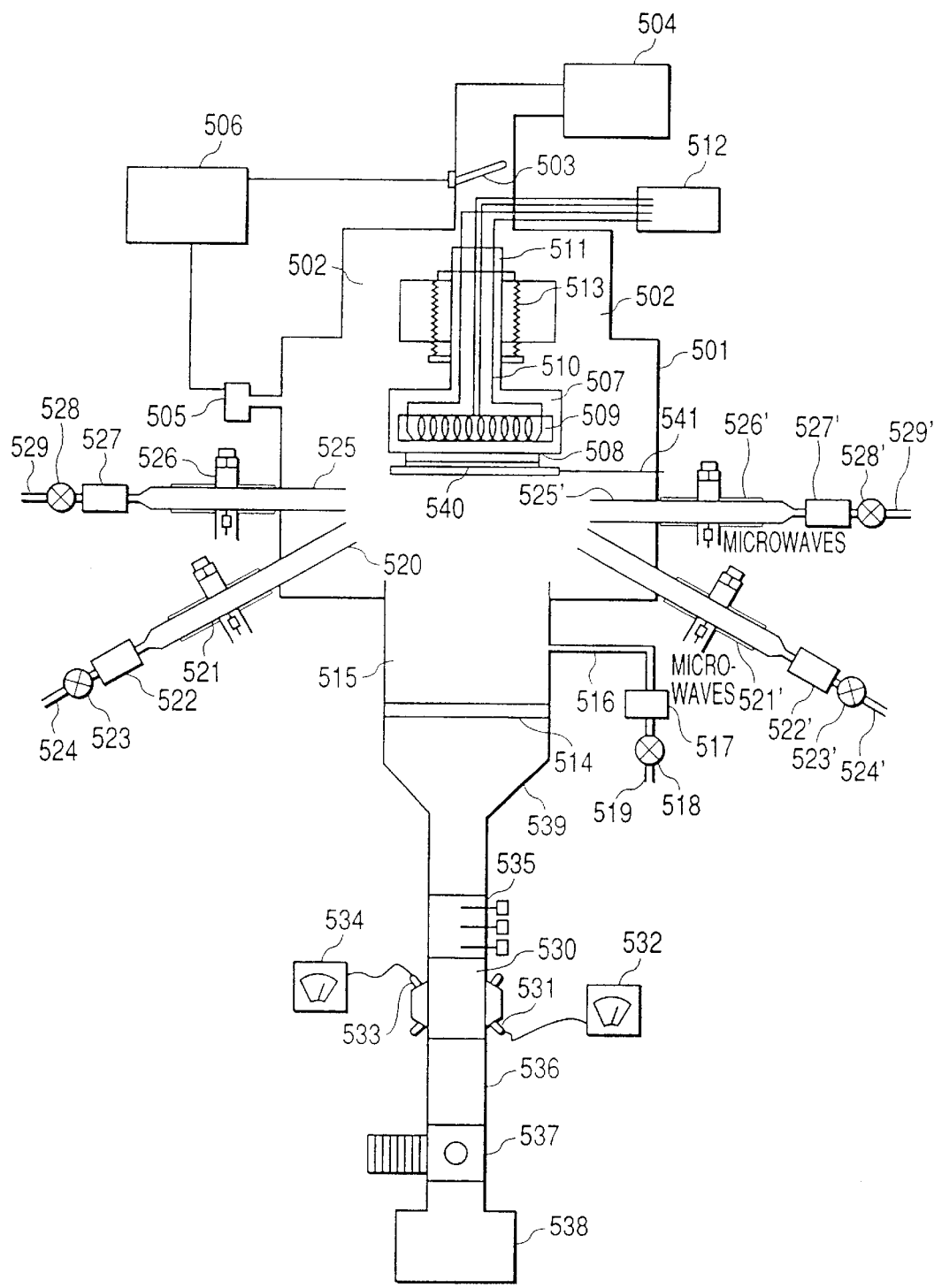
FIG. 4 is a schematic representation of an HRCVD film formation apparatus for forming polycrystal silicon films, used in Examples 2, 3, and 4 of the present invention and Comparative Example 1.

The substrate was then taken out and mounted in a CVD film formation system shown in FIG. 4.

The film formation system will be described below in detail with reference to FIG. 4.

Numeral 501 designates a vacuum chamber for film formation. Numeral 502 denotes an exhaust pipe of the vacuum chamber 501, which consists of two pipes in order to uniformize the flow of gas, the two pipes being finally coupled into one pipe to be connected to an evacuator 504. An electric-motor-operated butterfly valve 503 for regulation of pressure is connected to a midpoint of the exhaust pipe 502, and the valve travel is regulated to yield a desired pressure by a pressure regulator 506 on the basis of a signal from pressure gage 505.

Numeral 507 represents a substrate fulcrum, on a surface of which a substrate 508 for film formation is mounted. The substrate fulcrum 507 is provided with a heater block 509 with a heater 510 buried therein, which is used for heating the substrate 508 to a desired temperature. Numeral 511 denotes a thermocouple attached onto the heater block 509 to measure the temperature of the heater block 509. In order to maintain the surface temperature of the substrate 508 at the desired temperature, a temperature controller 512 controls the temperature of the heater block 509 to a preliminarily calibrated value.

Numeral 513 indicates a bellows cylinder, which is mounted so as to allow the position of the substrate fulcrum 507 to be vertically moved in FIG. 4. The substrate fulcrum 507 is electrically connected to the vacuum chamber 501.

Numeral 515 designates a microwave cavity, in which $H_2$ gas introduced from a gas introducing pipe 516 is exited by microwave power guided through a microwave inlet port 514 of alumina to induce plasma glow discharge, thereby generating H radicals.

Numeral 517 denotes a flow controller for controlling the flow rate of hydrogen gas, which is connected via a valve 518 to a hydrogen gas pressure regulator (not shown) and a hydrogen gas cylinder (not shown) by a gas pipe 519.

The H radicals thus generated collide and react with $SiF_n$ radicals introduced from an $SiF_n$ radical introducing pipe 520, thereby generating $SiH_lF_m$ radicals with film deposition capability.

Numeral 521 is a microwave space for generating $SiF_n$ radicals, in which silicon fluoride gas flowing in a reactor tube for generating $SiF_n$ radicals, continued to the $SiF_n$ radical introducing pipe 520, is exited by microwave plasma whereby the silicon fluoride gas is decomposed to generate $SiF_n$ radicals. Numeral 522 represents a flow controller for the silicon fluoride gas, which is connected via a valve 523 to a silicon fluoride gas pressure regulator (not shown) and a silicon fluoride gas cylinder (not shown) by a gas pipe 524.

Numeral 525 denotes a dopant radical introducing pipe, through which radicals generated by decomposition of a doping gas are introduced. The dopant radicals thus introduced are injected into the lattice of the polycrystalline Si thin film in an as-introduced state if they have high reactivity, or in a reduced state with enhanced reactivity by collision with H radicals if they have low reactivity. Numeral 526 stands for a microwave space for decomposing the dopant gas. Numeral 527 denotes a flow controller for the dopant gas and 528 a valve. Numeral 529 designates a gas pipe for introduction of the dopant gas, which is connected to a pressure gage (not shown) and a cylinder (not shown) for the dopant gas.

Numeral 530 designates a waveguide for monitoring power of input wave and power of reflected wave. Numeral 531 denotes an input wave power detector, and a meter 532 monitors the power of the input wave. Numeral 533 represents a reflected wave power detector, and a meter 534 monitors the power of the reflected wave. Numeral 536 represents a waveguide, and 537 an isolator for preventing the reflected wave from entering a microwave power supply 538. Numeral 538 denotes the microwave power supply used for generation of H radicals.

Two sets of the $SiF_n$ radical introducing pipe 520 and the dopant radical introducing pipe 525 are located at left and right positions in plane symmetry in order to uniformize the introduction of radicals over the substrate surface, i.e., in order to uniformize the film thickness.

Numeral 539 denotes a tapered waveguide, which is used for connection between the microwave inlet port 514 and an ordinary rectangular waveguide. Numeral 535 denotes a matching unit for matching the microwave power supply system with the load, which is comprised of three stubs.

Numeral 540 represents a shutter, which prevents unwanted film formation from being implemented on the substrate. Numeral 541 indicates a shutter control bar.

In the system of FIG. 4, the substrate temperature was set at 400° C. and in a closed state of the shutter 540 the $H_2$ gas was flowed at 100 sccm from the gas introducing pipe 516 and through the flow controller 517. The pressure inside the chamber 501 was set at 50 Pa by the pressure controller (not shown).

After the pressure in the chamber 501 became stable at 50 Pa, the microwave power was applied at 400 W to produce a glow discharge plasma with hydrogen gas in the microwave cavity 515. After the discharge became stable, the shutter was opened to go into the film formation step.

The film formation step consisted of three processes (1) to (3) below and these processes were repeated 30 times in the order of (1)→(2)→(3)→(1) to deposit the polycrystalline Si thin film doped with P (phosphorus).

(1) The $SiF_4$ gas (flow rate: 60 sccm) was introduced as a source gas into the $SiF_n$ radical introducing pipe 520 and the microwave power of 100 W was applied to introduce $SiF_n$ radicals into the interior of the chamber 501 for ten seconds, thereby depositing a polycrystalline Si thin film.

(2) The $PF_5$ gas diluted to 2% with $H_2$ gas (flow rate for the dilute gas: 2 sccm) was introduced as a doping gas into the dopant radical introducing pipe 525 and the microwave power of 100 W was applied to introduce the dopant radicals along with H radicals into the interior of the chamber 501 for ten seconds, thereby doping the deposited film with P (phosphorus) (while the introduction of $SiF_4$ gas was halted).

(3) The introduction of the dopant gas into the interior of the chamber 501 was terminated, and only H radicals were introduced into the interior of the chamber 501 for ten seconds to implement a surface treatment of the deposited film with H radicals.

No particular change was made in the hydrogen gas introducing amount and the applied microwave power throughout the processes (1), (2), and (3).

During periods without flow of the $SiF_4$ gas or the doping gas, the application of the microwave power to decompose each gas was halted.

The shutter was closed at the time of the end of film formation. As a consequence, the Si film 33 doped with P was formed on the Ag reflecting film 32.

While the substrate temperature was set at 550° C. and the shutter 540 was kept in the closed state, the $H_2$ gas was flowed at 100 sccm from the gas introducing pipe 516 and through the flow controller 517. The pressure inside the chamber 501 was set at 50 Pa by the pressure controller (not shown).

After the pressure inside the chamber 501 became stable at 50 Pa, the microwave power of 400 W was applied to produce the glow discharge plasma with hydrogen gas in the microwave cavity 515. After the discharge became stable, the shutter was opened to go into the film formation step of the i-layer.

The film formation step of the i-layer generally consisted of process I and process II.

The process I consists of two processes (1) and (2) below, and this process was repeated 100 times. Without interruption thereafter, the process II was carried out to form the Si thin film 34.

Process I (1) The SiF$_4$ gas (flow rate: 60 sccm) was introduced into the SiF$_n$ radical introducing pipe 520 and the microwave power of 100 W was applied to introduce the SiF$_n$ radicals into the interior of the chamber 501 for ten seconds, thereby depositing a polycrystalline Si thin film.

(2) The introduction of the SiF$_n$ radicals into the interior of the chamber 501 was halted, and only H radicals were introduced into the interior of the chamber 501 for ten seconds to implement the treatment of the deposited film with H radicals. No particular change was made in the hydrogen gas introducing amount and in the applied power of the microwave for excitation of hydrogen gas throughout the processes (1) and (2). During periods without flow of the SiF$_4$ gas, the application of the microwave power to decompose the SiF$_4$ gas was halted.

The process II excluded the process (2) in the process I, and the film formation process was continuously carried out without stopping the introduction of the SiF$_n$ radicals into the interior of the chamber 501.

The film formation by the process II was carried out for two hours and thereafter the shutter was closed to end the film formation.

After this, the substrate temperature was changed to 250° C. After the temperature became stable, the H$_2$ gas was flowed at 100 sccm from the gas introducing pipe 516. The pressure was set at 50 Pa. After the pressure in the chamber 501 became stable, the shutter was opened for fifteen minutes to implement the H$_2$ plasma processing on the sample surface.

After that, while the substrate temperature was maintained at 250° C., the interior of the chamber was evacuated well. After the discharge became stable, the shutter was opened to go into the film formation step of the B-doped Si film 35. The film formation step of the B-doped Si film 35 consisted of three processes (1) to (3) below.

Namely, the three processes are as follows.

(1) The SiF$_4$ gas (flow rate: 100 sccm) was introduced as a source gas into the SiF$_n$ radical introducing pipe 520 and the microwave power of 100 W was applied to introduce the SiF$_n$ radicals into the interior of the chamber 501 for ten seconds, thereby depositing a polycrystalline Si thin film.

(2) The BF$_3$ gas diluted to 2% with H$_2$ gas (flow rate for the dilute gas: 3 sccm) was introduced as a doping gas into the dopant radical introducing pipe 525 and the microwave power of 100 W was applied to introduce the dopant radicals along with H radicals into the interior of the chamber 501 for ten seconds, thereby doping the deposited film with B (boron) (while the introduction of SiF$_4$ gas was halted)

(3) The introduction of the dopant gas into the interior of the chamber 501 was terminated, and only H radicals were introduced into the interior of the chamber 501 for ten seconds to implement the surface treatment of the deposited film with H radicals.

No particular change was made in the hydrogen gas introducing amount and the applied microwave power throughout the processes (1), (2), and (3). During periods without flow of the SiF$_4$ gas or the doping gas, the application of the microwave power to decompose each gas was halted.

These processes were repeated three times in the order of (1)→(2)→(3)→(1) to deposit the B-doped Si thin film (which was crystallized in this case and was a polycrystalline Si thin film). As described above, the Ag reflecting film 32, the n-type silicon layer 33, the i-type silicon layer 34, and the p-type semiconductor layer 35 were formed on the stainless steel substrate 31.

The substrate with the pn junction formed thereon was taken out of the CVD film formation system and was again put into the electron beam evaporation system. A mask was mounted on the surface of the substrate and the collecting electrodes were formed in the structure of three layers of Cr/Ag/Cr. The collecting electrodes were the comb-shaped electrodes having the width of 0.1 mm and the spacing of 5 mm.

Then, the substrate was put into the sputtering system and sputtering was carried out with an In$_2$O$_3$ target in an oxygen atmosphere of 10 Pa to deposit the antireflection coating 37 in the thickness of 65 nm on the collecting electrodes 36.

The solar cell was made in the structure shown in FIG. 2, as described above. This sample will be referred to hereinafter as a solar cell D.

For comparison's sake, another solar cell was produced under the same conditions as the solar cell D, with the exception that the P-doped Si thin film was made under the same conditions except for continuous introduction of the SiF$_n$ radicals and the dopant radicals into the chamber 501, that the film formation time of the P-doped Si thin film was five minutes, and that without the process I for film formation of the i-layer, the film formation time of the process II was two hours and eighteen minutes. This solar cell will be referred to as a comparative solar cell E.

Another solar cell was also produced in such a manner that the P-doped Si thin film was made under the same conditions as in the comparative solar cell E and that the film formation of the i-layer was done by the process of process I and process II as in the case of the solar cell D and under the same conditions as in the solar cell D, with the exception that during the film formation of the process I, the flow rate of the SiF$_4$ gas was 10 sccm and the film formation time was two hours and fifteen minutes. This solar cell will be referred to as a comparative solar cell F.

The solar cells D, E, and F produced in this way were subjected to irradiation with the light of 100 mW/cm$^2$ from the AM1.5 simulator to measure the I–V characteristics.

As a result, the solar cell D was excellent in both the short-circuit current and the fill factor. The comparative solar cell E demonstrated an abnormal shape of the I–V curve and the unfavorable fill factor. The comparative solar cell E showed the short-circuit current not larger than the solar cell D, but a large current flowed under application of the backward voltage of −2 V to the cell; i.e., the electric current was large when the photocharge generated in the cell was forced to the external circuit. The abnormal shape of the I–V curve suggests the structure wherein there exist high resistance components in series.

The comparative solar cell F exhibited the favorable fill factor but the short-circuit current and the current under application of the backward voltage of −2 V to the cell both were small.

In order to check the crystal structures of these solar cells, sectional images were taken with TEM and the crystal structures of the solar cells were observed.

In the sample of the solar cell D, the crystal nuclei were generated in the n-layer and the crystals were grown in the deformed cone or pyramid structure with the solid angle of about 75° on the basis of the crystal nuclei in the i-layer up to the interface with the p-layer. The crystal nucleus density of the perpendicularly grown crystals estimated from the TEM image was $2 \times 10^9$ cm$^{-3}$. In the horizontal directions, the crystals were grown to contact the neighboring crystals. In the perpendicular direction, the crystals were grown to contact the neighboring crystals and thereafter grown straight in the i-layer up to the interface with the p-layer. The grain diameters of the crystals in the lateral direction in this sample were 150 to 350 nm. There was unevenness of about 75 nm at the distal ends of the crystals. The B-doped p-type thin film Si semiconductor layer (third semiconductor layer) 5 having the grain diameters of about 50 nm was formed over the unevenness.

The sample of the comparative solar cell E was grown in much the same manner as the solar cell D, with the exception that the crystal growth originated in the i-layer. There was no crystal generation observed in the n-layer. The crystal generation in the n-layer cannot be denied completely, but even if crystals were generated there the crystals did not undergo growth with deposition. There also exists a high-resistance amorphous i-layer between the n-layer and the crystal grains in the i-layer. (The existence of this layer was reconfirmed by an electron diffraction image of this part.) The existence of this high-resistance amorphous i-layer is considered to be the cause of degrading the fill factor among the solar cell characteristics.

In the sample of the comparative solar cell F, there was no crystal generation observed in the n-layer, as in the case of the sample of the comparative solar cell E.

A number of crystals were perpendicularly grown in the i-layer from the interface between the n-layer and the i-layer. The crystal nucleus density of the perpendicularly grown crystals estimated from the TEM image was $9 \times 10^{10}$ cm$^{-3}$. The grain diameters of the crystals in the lateral direction were about 25 nm. The unevenness was about 10 nm at the distal ends of the crystals.

After the samples of the solar cells A, B, and C were continuously exposed to the light of AM1.5 and 100 mW/cm$^2$ for a long period (about 100 hours), there was no change of characteristics observed in either of the solar cells.

Example 3

Solar cells were produced under the same conditions as in Example 2, with the exception that each of the process time of (3) in the film formation of the n-layer and the process time of (2) in the process I in the film formation of the i-layer was set to 0 sec, 5 sec, 20 sec, and 30 sec, respectively. However, there was no crystal grown under the conditions that each of the process time of (3) in the film formation of the n-layer and the process time of (2) in the process I in the film formation of the i-layer was 0 sec and 5 sec. Therefore, after the film formation of the n-layer and before the film formation of the i-layer, the H$_2$ gas was flowed at 200 sccm, the pressure inside the chamber was controlled at 400 Pa, the substrate was heated at 600° C., and this state was maintained for twelve hours. Thereafter, the substrate temperature was reduced back to 400° C.

Figure 11:
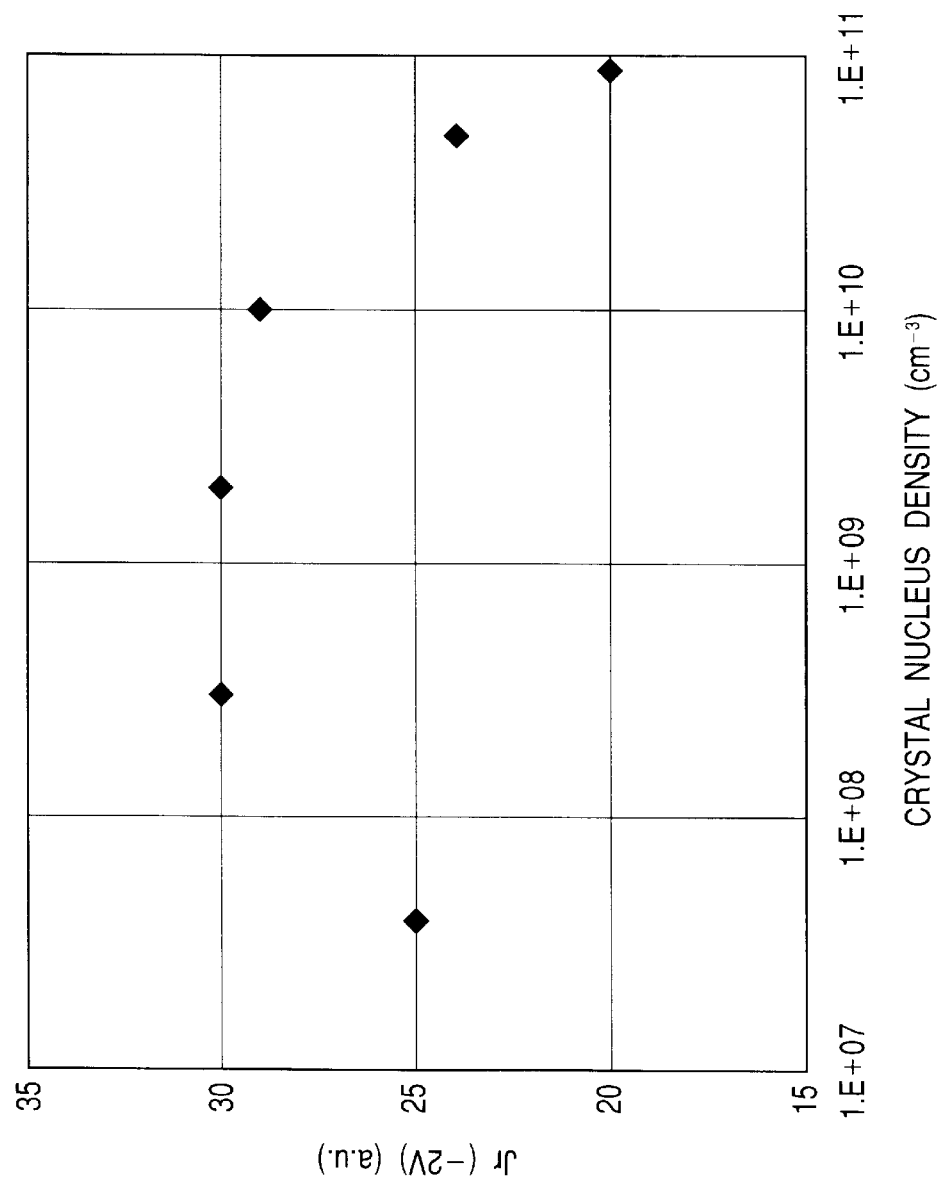
FIG. 11 is a graphical representation showing the result of Example 3, which shows a relation between crystal nucleus density of perpendicularly grown crystals estimated from TEM images and electric current (Jr(−2 V)) upon application of the backward voltage of −2 V to the cell.
Figure 12:
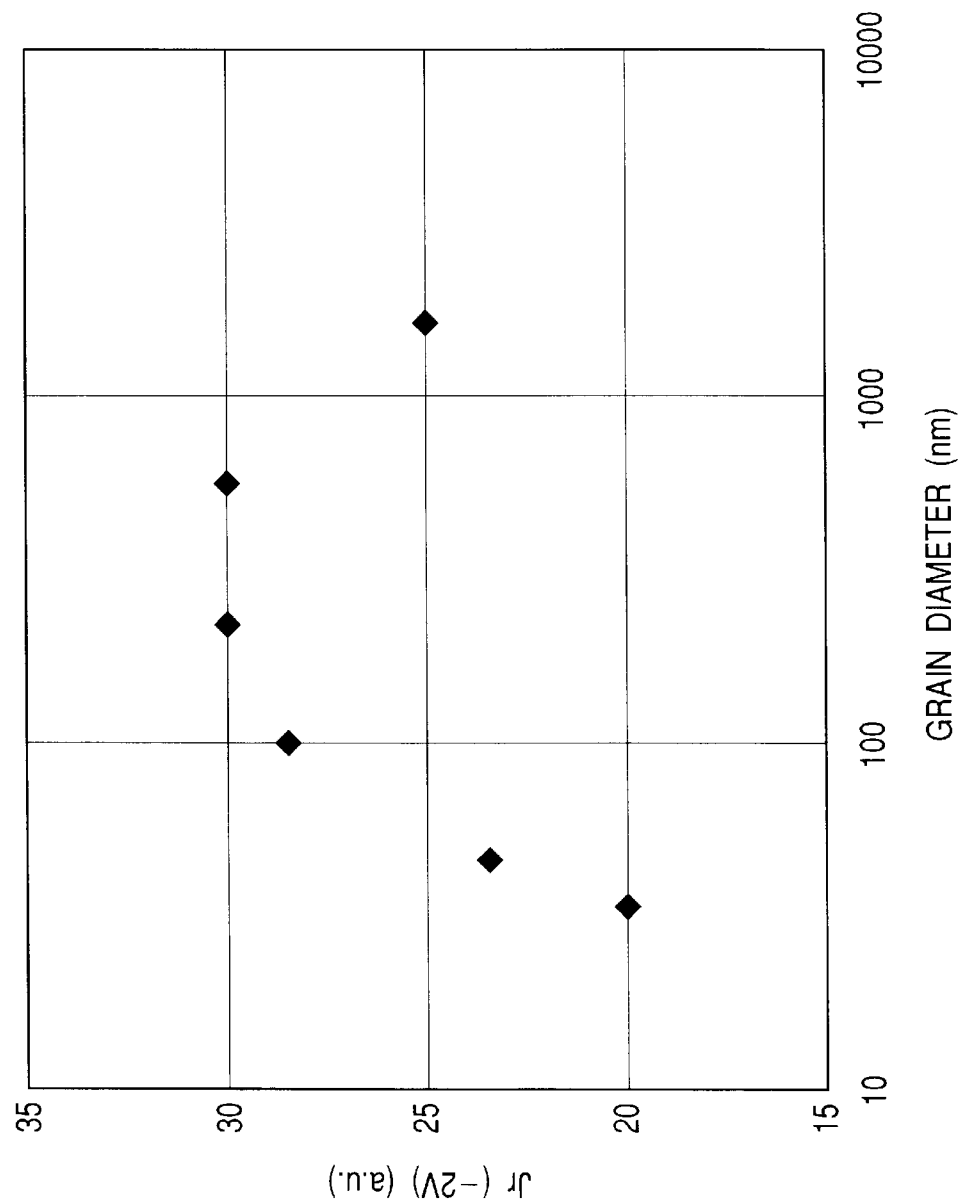
FIG. 12 is a graphical representation showing the result of Example 3, which shows a relation between grain diameter and electric current (Jr(−2 V)) upon application of the backward voltage of −2 V to the cell.
Figure 13:
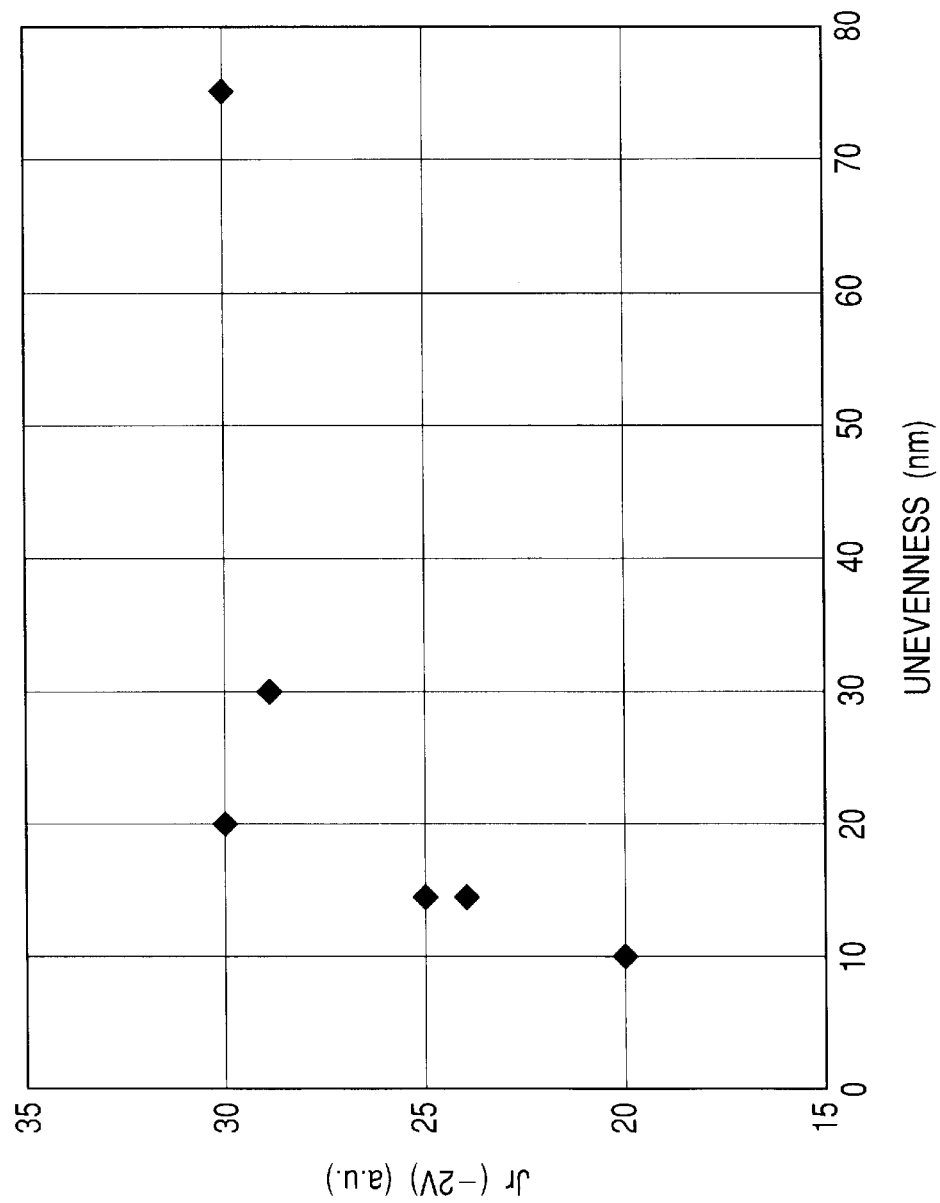
FIG. 13 is a graphical representation showing the result of Example 3, which shows a relation between unevenness at distal ends of crystals and electric current (Jr(−2 V)) upon application of the backward voltage of −2 V to the cell.

After that, the film formation of the i-layer was carried out. The solar cells thus obtained will be referred to as solar cells G, H, I, and J, respectively. It was shown by X-ray diffraction that the solar cells were all oriented to (110). In all the samples the layer thickness of the i-layer was about 2 μm. Sectional TEM images were taken for the respective samples. The characteristics of each solar cell were measured. From the results of these solar cells and the solar cells D, F produced in Example 2, Table 1 and FIGS. 11, 12, and 13, respectively, present the relations with the current (Jr(−2 V)) upon application of the backward voltage of −2 V to the cell, of the crystal nucleus density of the perpendicularly grown crystals estimated from the TEM images, the lateral grain diameters at the interface with the p-layer, and the unevenness at the distal ends of the crystals at the interface with the p-layer.

TABLE 1

| Sample | Crystal nucleus density (cm$^{-3}$) | Grain diameter (nm) | Unevenness of crystal surface (nm) | Jr (−2 V) (a.u.) |
|---|---|---|---|---|
| F | $9 \times 10^{10}$ | 33 | 10 | 20 |
| J | $5 \times 10^{10}$ | 45 | 15 | 24 |
| I | $1 \times 10^{10}$ | 100 | 30 | 29 |
| D | $2 \times 10^9$ | 220 | 75 | 30 |
| H | $3 \times 10^8$ | 580 | 20 | 30 |
| G | $4 \times 10^7$ | 1600 | 15 | 25 |

It is apparent from these results that the conditions for extracting a large current upon application of the backward voltage of −2 V to the cell, i.e., a large current by forced flow of the photocharge generated in the cell to the external circuit are that the crystal nucleus density is not more than $1 \times 10^{10}$ cm$^{-3}$, the average grain diameter is not less than 100 nm, and the unevenness in the crystal surface is not less than 20 nm.

The reason why the current is low in the sample of the solar cell G is assumed as follows: the optical absorption coefficient is small because of the large grain diameters and the incident light is not absorbed well in the thickness of 2 μm. It is thus speculated that the current will increase sufficiently by increasing the thickness.

However, in consideration of the production time increased by that degree, the crystals of such grain diameters are disadvantageous in terms of production.

Example 4

Solar cells were produced under the same conditions as in Example 2, with the exception that the microwave power applied in the process (1) in the film formation of the n-layer was set to either of 80 W, 150 W, and 200 W, respectively. The solar cells thus obtained were named solar cells K, L, and M, respectively. It was found from the result of X-ray diffraction that the solar cells were all oriented to (110). In all the samples the thickness of the i-layer was about 2 μm. Sectional TEM images were taken for the respective samples. The characteristics of each solar cell were measured. From the results of these solar cells and the solar cell D produced in Example 2, Table 2 below presents values of the solid angle of the deformed cone or pyramid shape of the region where each crystal grown from a crystal nucleus estimated from the TEM image is grown to contact horizontally neighboring crystals, and the current (Jr(−2 V)) upon application of the backward voltage of −2 V to the cell.

TABLE 2

| Solar cell | Microwave power (W) | Solid angle of cone or pyramid shape (°) | Jr (−2 V) (a.u.) |
|---|---|---|---|
| K | 80 | 90 | 31 |
| D | 100 | 75 | 30 |
| L | 150 | 60 | 29 |
| M | 200 | 50 | 23 |

Figure 14:
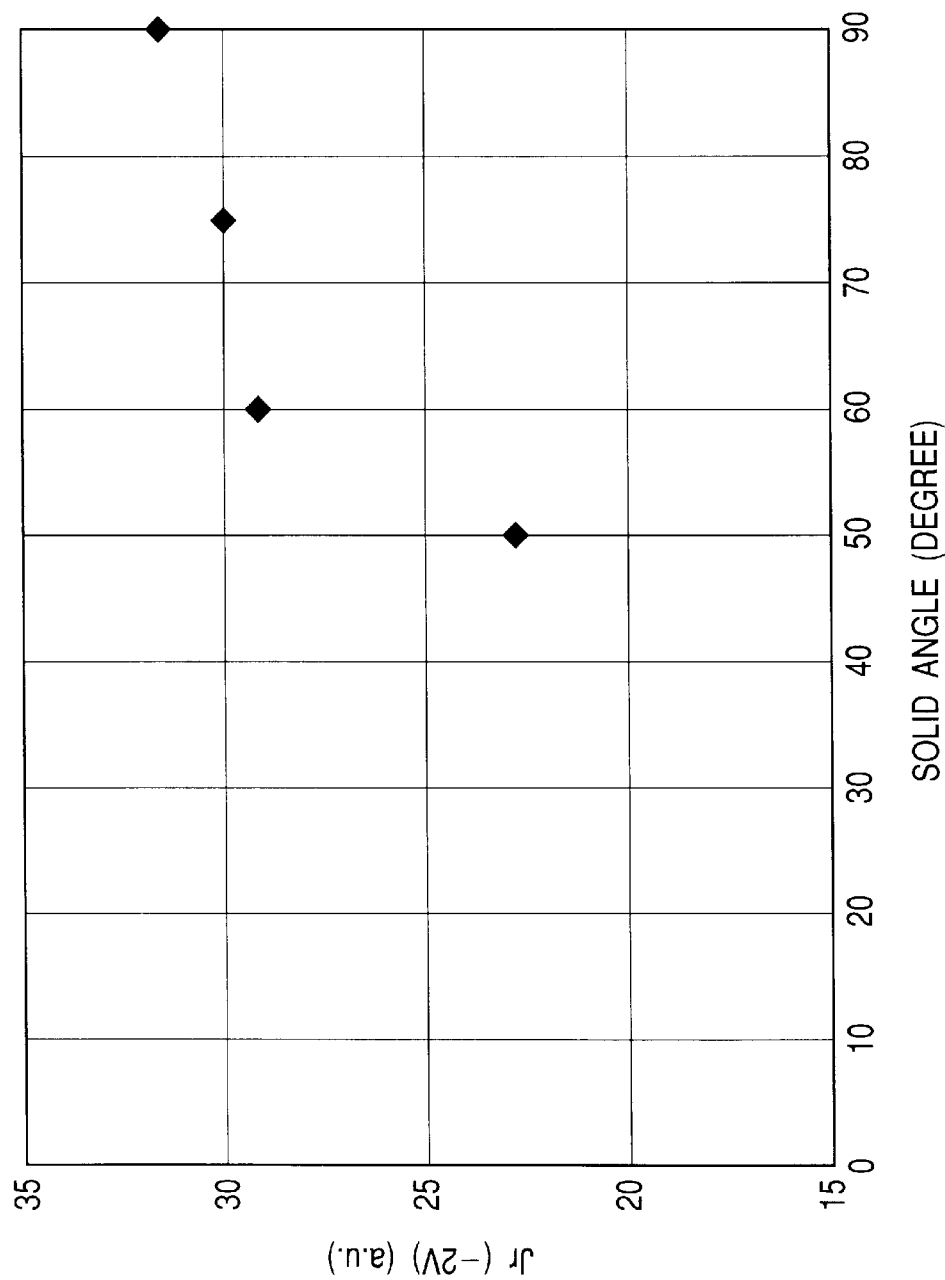
FIG. 14 is a graphical representation showing the result of Example 4, which shows a relation between magnitude of solid angle of a deformed cone or pyramid shape of a region in which crystals grown from crystal nuclei are grown horizontally to contact neighboring crystals, estimated from TEM images, and electric current (Jr(−2 V)) upon application of the backward voltage of −2 V to the cell.
Figure 15:
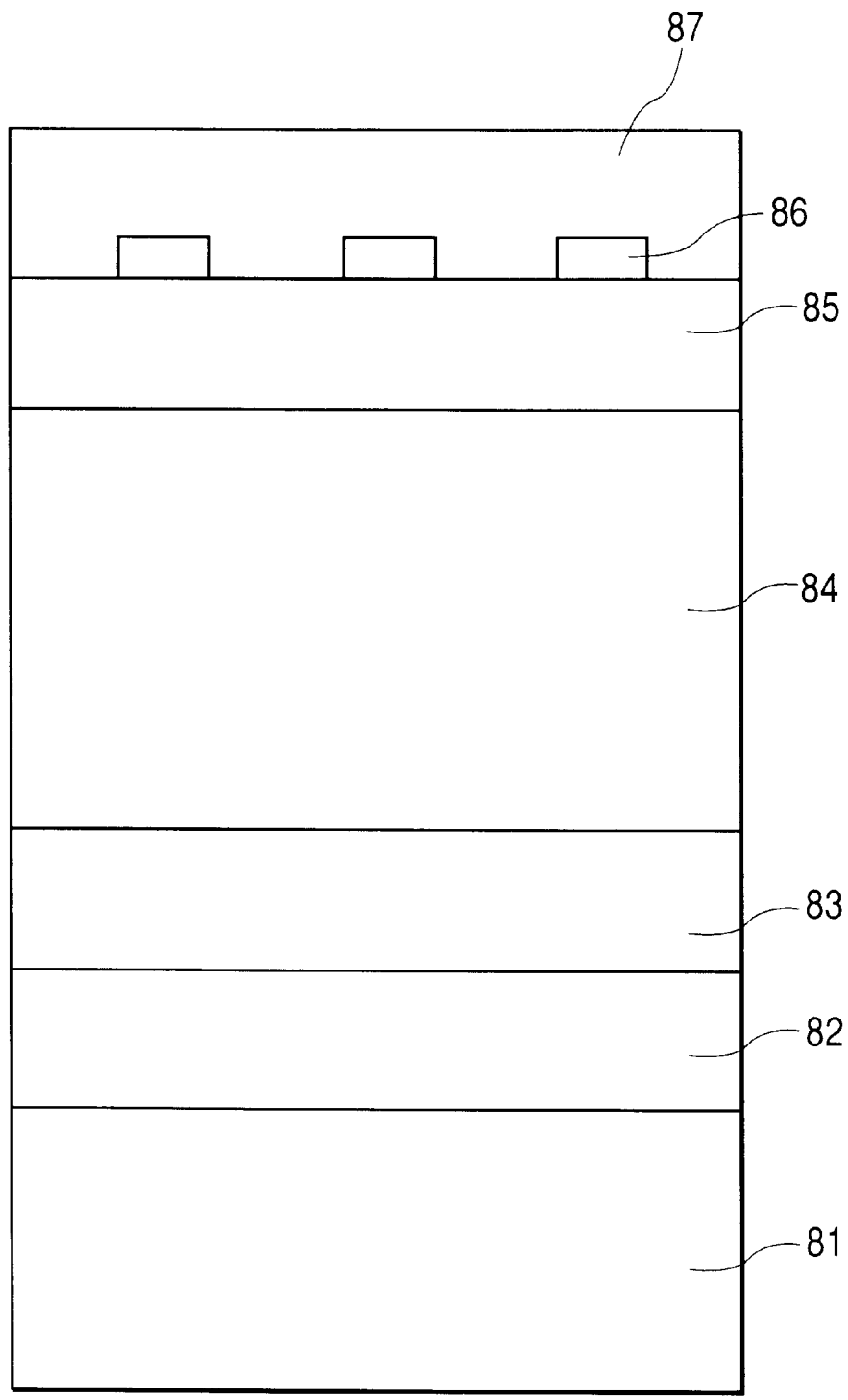
FIG. 15 is a schematic representation showing a configuration example of a conventional solar cell.
Figure 16:
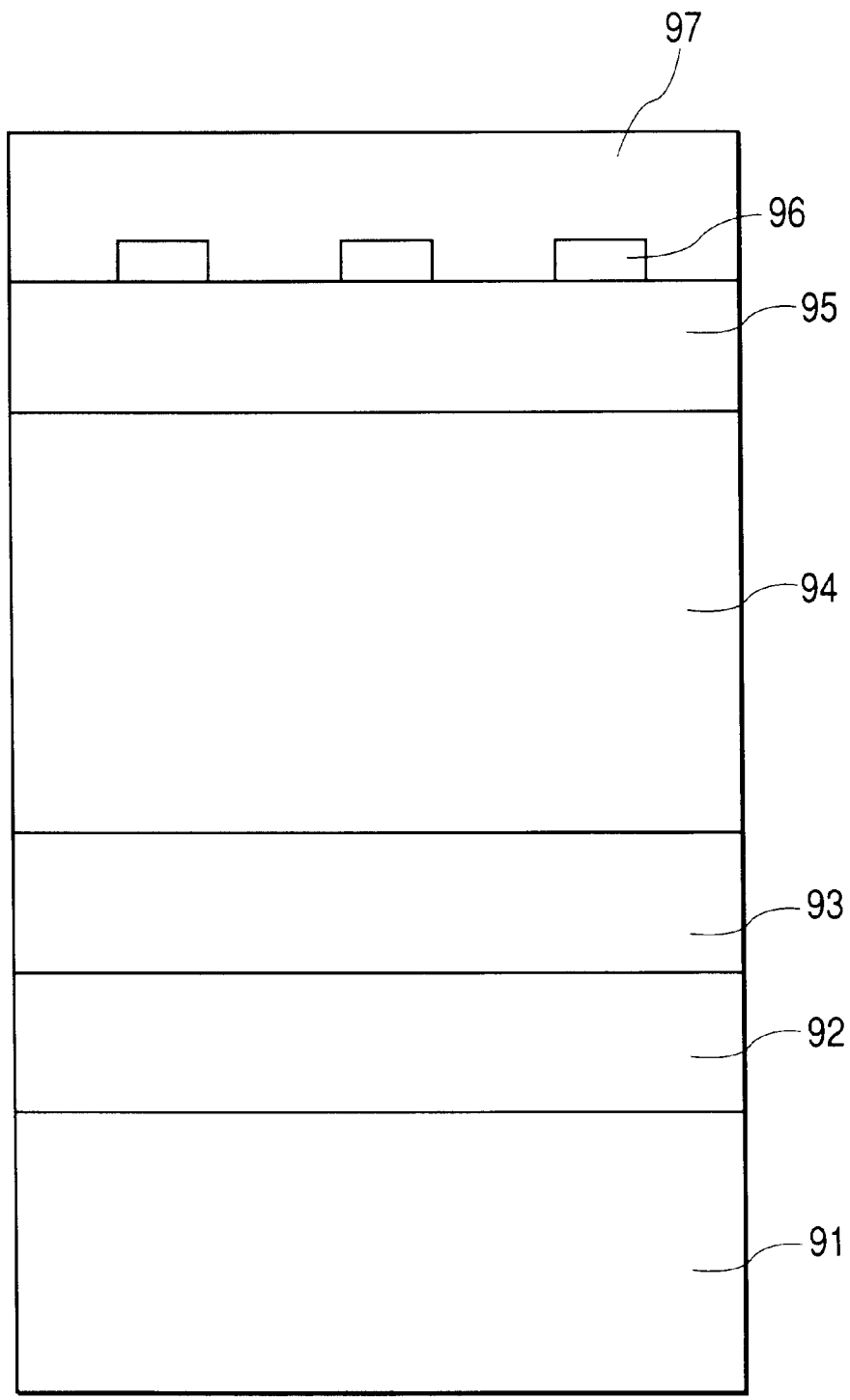
FIG. 16 is a schematic representation showing another configuration example of a conventional solar cell.

FIG. 14 presents a relation between the magnitude of the solid angle of the cone or pyramid shape and the current (Jr(−2 V)) upon application of the backward voltage of −2 V to the cell.

It is seen from this result that the condition for extracting a large current upon application of the backward voltage of −2 V to the cell, i.e., a large current by forced flow of the photocharge generated in the cell to the external circuit is that the magnitude of the solid angle of the deformed cone or pyramid shape of the region where each crystal grown from a crystal nucleus estimated from the TEM image is grown to contact horizontally neighboring crystals, is not less than 60°.

Comparative Example 1

A comparative solar cell N was produced under the same conditions as in Example 2, with the exception that during the film formation of the n-layer and the i-layer the flow rate of $H_2$ was 10 sccm and the substrate temperature 550° C. The solar cell obtained was checked by X-ray diffraction and its crystals were oriented to (100). The solar cell characteristics were measured for the comparative solar cell N and it was found that the current was 30% smaller than that of the solar cell D.

As described above, the thin film polycrystalline silicon solar cells according to the present invention include the solar cell of the $n^+/n^-/p^+$ structure wherein the crystal nuclei originate in the $n^+$ layer and the crystal layer of the crystal grains grown in the $n^-$ layer up to the interface with the $p^+$ layer is used as the generating layer and transport layer of photocharge; and the solar cell of the n/i/p structure wherein the crystal nuclei originate in the n-layer and the crystal layer of the crystal grains grown in the i-layer to the interface with the p-layer is used as the generating layer and transport layer of photocharge; whereby it is feasible to provide the solar cells with excellent characteristics as to both the short-circuit current and the fill factor.

Accordingly, the present invention has permitted the provision of the thin film polycrystalline silicon solar cells with excellent photoelectric conversion efficiency.

What is claimed is:

1. A thin film polycrystalline solar cell comprising a substrate; a first semiconductor layer provided on the substrate and comprised of Si highly doped with a conductivity-type controlling impurity; a second semiconductor layer provided on the first semiconductor layer and comprised of polycrystalline Si slightly doped with a conductivity-type controlling impurity of the same conductivity-type as that of the first semiconductor layer; and a third semiconductor layer provided on the second semiconductor layer and highly doped with a conductivity-type controlling impurity of a conductivity-type opposite to that of the impurities for the doping of the first and the second semiconductor layers, wherein crystal grains grown from crystal nuclei generated in the first semiconductor layer are continuously grown to form the first and the second semiconductor layers, are also horizontally grown to contact neighboring crystal grains, and are perpendicularly grown to form an interface with the third semiconductor layer, and wherein a portion of the first semiconductor layer which forms an interface with the substrate comprises amorphous silicon.

2. A thin film polycrystalline solar cell comprising a substrate; a first semiconductor layer provided on the substrate and comprised of Si doped with a conductivity-type controlling impurity; a second semiconductor layer provided on the first semiconductor layer and comprised of Si of an intrinsic conductivity type; and a third semiconductor layer provided on the second semiconductor layer and doped with a conductivity-type controlling impurity of a conductivity-type opposite to that of the impurity for the doping of the first semiconductor layer, wherein crystal grains grown from crystal nuclei generated in the first semiconductor layer are continuously grown in the first semiconductor layer and the second semiconductor layer, are horizontally grown to contact neighboring crystal grains and are perpendicularly grown to form an interface with the third semiconductor layer, and wherein a portion of the first semiconductor layer which forms an interface with the substrate comprises amorphous silicon.

3. The thin film polycrystalline solar cell according to claim 1 or 2, wherein the crystal nucleus density of the crystals perpendicularly grown in the first semiconductor layer is not more than $1 \times 10^{10}$ cm$^{-3}$.

4. The thin film polycrystalline solar cell according to claim 1 or 2, wherein the shape of a region in which each crystal grown from a crystal nucleus is horizontally grown to contact neighboring crystals, in the first semiconductor layer, is a cone or pyramid having an apex angle of not less than 60° in a cross section parallel to the direction of the growth.

5. The thin film polycrystalline solar cell according to claim 1 or 2, wherein the crystals grown in the second semiconductor layer up to the interface with the third semiconductor layer have an average grain diameter of not less than 100 nm in a direction parallel to the substrate.

6. The thin film polycrystalline solar cell according to claim 1 or 2, wherein the interface formed between the third semiconductor layer and the crystals grown as the second semiconductor layer has an unevenness of not less than 20 nm.

7. A method of forming a thin film polycrystalline solar cell by stacking on a substrate a first semiconductor layer of a thin film comprised of Si highly doped with a conductivity-type controlling impurity, stacking thereon a second semiconductor layer of a thin film comprised of polycrystalline Si slightly doped with a conductivity-type controlling impurity of the same conductivity type as that of the first semiconductor layer, and further stacking thereon a third semiconductor layer of a thin film highly doped with a conductivity-type controlling impurity of a conductivity-type opposite to that of the impurities for the doping of the first and the second semiconductor layers, thereby forming a solar cell with a semiconductor junction structure of $n^+/n^-/p^+$ or $p^+/p^-/n^+$, the method comprising: repeatedly carrying out film deposition and $H_2$ plasma processing to form the first semiconductor layer; then growing crystal grains from crystal nuclei generated in the first semiconductor layer in a direction perpendicular to the substrate and also growing the crystal grains in a horizontal direction until the crystal grains contact neighboring crystal grains, and also effecting continuous growth of the crystal grains in the second semiconductor layer up to an interface with the third semiconductor layer, thereby forming the second semiconductor layer, wherein a portion of the first semiconductor layer which forms an interface with the substrate comprises amorphous silicon.

8. A method of forming a thin film polycrystalline solar cell by stacking on a substrate a first semiconductor layer of a thin film comprised of Si doped with a conductivity-type controlling impurity, stacking thereon a second semiconductor layer of a thin film comprised of Si of an intrinsic conductivity type, and further stacking thereon a third semiconductor layer of a thin film doped with a conductivity-type controlling impurity of a conductivity-type opposite to that of the impurity for the doping of the first semiconductor layer, thereby forming a solar cell with a semiconductor junction structure of n/i/p or p/i/n, the method comprising: repeatedly carrying out film deposition and $H_2$ plasma processing to form the first semiconductor layer; then growing crystals from crystal nuclei generated in the first semiconductor layer in a direction perpendicular to the substrate and also growing the crystals in a horizontal direction until the crystals contact neighboring crystals, and also effecting continuous growth of the crystals in the second semiconductor layer up to an interface with the third semiconductor layer, thereby forming the second semiconductor layer, wherein a portion of the first semiconductor layer which forms an interface with the substrate comprises amorphous silicon.

9. The method according to claim 7 or 8, wherein the crystal nucleus density of the crystals perpendicularly grown in the first semiconductor layer is not more than $1 \times 10^{10}$ $cm^{-3}$.

10. The method according to claim 7 or 8, wherein the shape of a region in which each crystal grown from a crystal nucleus is horizontally grown to contact neighboring crystals, in the first semiconductor layer, is a cone or pyramid having an apex angle of not less than 60° in a cross section parallel to the direction of the growth.

11. The method according to claim 7 or 8, wherein the crystals grown in the second semiconductor layer up to the interface with the third semiconductor layer have an average grain diameter of not less than 100 nm in a direction parallel to the substrate.

12. The method according to claim 7 or 8, wherein the interface formed between the third semiconductor layer and the crystals grown as the second semiconductor layer has an unevenness of not less than 20 nm.

13. The method according to claim 7 or 8, wherein the film deposition and hydrogen plasma processing steps are alternately carried out in the formation of the first semiconductor layer.

* * * * *